(12) United States Patent
Lim et al.

(10) Patent No.: US 11,193,017 B2
(45) Date of Patent: Dec. 7, 2021

(54) HARDMASK COMPOSITION, HARDMASK LAYER AND METHOD OF FORMING PATTERNS

(71) Applicant: SAMSUNG SDI CO., LTD., Yongin-si (KR)

(72) Inventors: Jaebum Lim, Suwon-si (KR); Sunyoung Yang, Suwon-si (KR); Sunghwan Kim, Suwon-si (KR); Seunghyun Kim, Suwon-si (KR); Yushin Park, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 174 days.

(21) Appl. No.: 16/455,942

(22) Filed: Jun. 28, 2019

(65) Prior Publication Data

US 2020/0017678 A1    Jan. 16, 2020

(30) Foreign Application Priority Data

Jul. 11, 2018 (KR) .......................... 10-2018-0080730

(51) Int. Cl.
| | | |
|---|---|---|
| *C08L 65/02* | (2006.01) | |
| *H01L 21/027* | (2006.01) | |
| *H01L 21/3213* | (2006.01) | |
| *G03F 7/11* | (2006.01) | |

(52) U.S. Cl.
CPC ............... *C08L 65/02* (2013.01); *G03F 7/11* (2013.01); *H01L 21/0276* (2013.01); *H01L 21/32139* (2013.01); *C08L 2203/20* (2013.01)

(58) Field of Classification Search
CPC .. C08L 65/02; C08L 2203/20; H01L 21/0276; H01L 21/32139; H01L 21/0271; G03F 7/11; G03F 7/094; G03F 7/0035; C08G 2261/76; C08G 2261/46; C08G 2261/135; C08G 61/10; C08G 2261/312; C08G 2261/11; C08G 2261/1422; C08G 2261/148; C08G 2261/149; C08G 2261/1646; C08G 2261/12; C08G 2261/598
USPC ........................................................ 430/311
See application file for complete search history.

(56) References Cited

U.S. PATENT DOCUMENTS

| | | |
|---|---|---|
| 5,968,679 A | 10/1999 | Kobayashi et al. |
| 9,534,097 B2 | 1/2017 | Hibbs |
| 2005/0124172 A1 | 6/2005 | Townsend, III et al. |
| 2010/0021830 A1 | 1/2010 | Kim et al. |
| 2013/0280655 A1 | 10/2013 | Higashihara et al. |
| 2015/0166711 A1 | 6/2015 | Cui et al. |
| 2016/0017174 A1 | 1/2016 | Nam et al. |
| 2016/0291472 A1 | 10/2016 | Shin et al. |
| 2017/0227850 A1 | 8/2017 | Nishimaki et al. |
| 2020/0044158 A1* | 2/2020 | Nakasugi ............ H01L 51/0057 |

FOREIGN PATENT DOCUMENTS

| | | |
|---|---|---|
| JP | 2004-356582 A | 12/2004 |
| JP | 4531400 B2 | 8/2010 |
| JP | 2018-100249 A | 6/2018 |
| KR | 10-0866015 B1 | 10/2008 |
| KR | 10-2010-0080140 A | 7/2010 |
| KR | 10-2012-0073817 A | 7/2012 |
| KR | 10-2014-0086735 A | 7/2014 |
| KR | 10-2016-0118782 A | 10/2016 |
| KR | 10-2017-0042500 A | 4/2017 |
| KR | 10-1747229 B1 | 6/2017 |
| KR | 10-1775898 B1 | 9/2017 |
| KR | 10-2018-0054300 A | 5/2018 |
| TW | 201600505 A | 1/2016 |
| WO | WO 2015-137486 A1 | 9/2015 |
| WO | WO 2018-056277 A1 | 3/2018 |
| WO | WO 2018-080008 A1 | 5/2018 |
| WO | WO 2018-093090 A1 | 5/2018 |

OTHER PUBLICATIONS

Japanese Office action dated Jul. 21, 2020.
Taiwanese Office action dated Aug. 5, 2020.

* cited by examiner

*Primary Examiner* — Caleen O Sullivan
(74) *Attorney, Agent, or Firm* — Lee IP Law, P.C.

(57) ABSTRACT

A hardmask composition, a hardmask layer, and a method of forming patterns, the composition including a solvent; and a polymer that includes a substituted biphenylene structural unit, wherein one phenylene of the biphenylene of the substituted biphenylene structural unit is substituted with at least one of a hydroxy-substituted C6 to C30 aryl group, and a hydroxy-substituted C3 to C30 heteroaryl group.

18 Claims, No Drawings

HARDMASK COMPOSITION, HARDMASK LAYER AND METHOD OF FORMING PATTERNS

CROSS-REFERENCE TO RELATED APPLICATION

Korean Patent Application No. 10-2018-0080730, filed on Jul. 11, 2018, in the Korean Intellectual Property Office, and entitled: "Hardmask Composition, Hardmask Layer and Method of Forming Patterns," is incorporated by reference herein in its entirety.

BACKGROUND

1. Field

Embodiments relate to a hardmask composition, a hardmask layer, and a method of forming patterns.

2. Description of the Related Art

Recently, the semiconductor industry has developed to an ultra-fine technique having a pattern of several to several tens nanometer size. Such ultrafine technique may utilize effective lithographic techniques.

SUMMARY

The embodiments may be realized by providing a hardmask composition including a solvent; and a polymer that includes a substituted biphenylene structural unit, wherein one phenylene of the biphenylene of the substituted biphenylene structural unit is substituted with at least one of a hydroxy-substituted C6 to C30 aryl group, and a hydroxy-substituted C3 to C30 heteroaryl group.

The one phenylene may be substituted with at least one of a hydroxyphenyl group, a hydroxynaphthyl group, a hydroxybiphenyl group, a hydroxydiphenylfluorenyl group, a hydroxydinaphthylfluorenyl group, a hydroxyanthracenyl group, a hydroxyfluoranthenyl group, a hydroxyacenaphthylenyl group, a hydroxyacenaphthenyl group, a hydroxyphenanthrenyl group, a hydroxybenzophenanthrenyl group, a hydroxypyrenyl group, a hydroxytriphenylenyl group, a hydroxychrysenyl group, a hydroxytetracenyl group, a hydroxybenzofluoranthenyl group, a hydroxyperlenyl group, a hydroxybenzopyrenyl group, a hydroxynaphthoanthracenyl group, a hydroxypentacenyl group, a hydroxybenzoperlenyl group, a hydroxydibenzopyrenyl group, a hydroxycoronenyl group, a hydroxypyridinyl group, a hydroxypyrimidinyl group, a hydroxy triazinyl group, a hydroxypyrrolyl group, a hydroxy imidazolyl group, a hydroxypyrazolyl group, a hydroxyindolo group, a hydroxyisoindolo group, a hydroxybenzimidazolyl group, a hydroxy indazolyl group, a hydroxyfuranyl group, a hydroxybenzofuranyl group, a hydroxythiophenyl group, a hydroxyoxazolyl group, a hydroxythiazolyl group, a dihydroxyphenyl group, a dihydroxynaphthyl group, a dihydroxybiphenyl group, a dihydroxydiphenylfluorenyl group, a dihydroxydinaphthylfluorenyl group, a dihydroxyanthracenyl group, a dihydroxyfluoranthenyl group, a dihydroxyacenaphthylenyl group, a dihydroxyacenaphthenyl group, a dihydroxyphenanthrenyl group, a dihydroxybenzophenanthrenyl group, a dihydroxypyrenyl group, a dihydroxytriphenylenyl group, a dihydroxychrysenyl group, a dihydroxytetracenyl group, a dihydroxybenzofluoranthenyl group, a dihydroxyperlenyl group, a dihydroxybenzopyrenyl group, a dihydroxynaphthoanthracenyl group, a dihydroxypentacenyl group, a dihydroxybenzoperlenyl group, a dihydroxydibenzopyrenyl group, a dihydroxycoronenyl group, a dihydroxypyridinyl group, a dihydroxypyrimidinyl group, a dihydroxytriazinyl group, a dihydroxypyrrolyl group, a dihydroxyimidazolyl group, a dihydroxypyrazolyl group, a dihydroxyindolo group, a dihydroxyisoindolo group, a dihydroxybenzimidazolyl group, a dihydroxyindazolyl group, a dihydroxyfuranyl group, a dihydroxybenzofuranyl group, a dihydroxythiophenyl group, a dihydroxyoxazolyl group, and dihydroxythiazolyl group.

The one phenylene may further include a least one of a substituted or unsubstituted C6 to C30 aryl group and a substituted or unsubstituted C3 to C30 heteroaryl group, and a substituent of the substituted C6 to C30 aryl group and the substituted C3 to C30 heteroaryl group may be deuterium, a halogen, a nitro group, a cyano group, an amino group, a C1 to C30 alkyl group, a C2 to C30 alkenyl group, a C2 to C30 alkynyl group, a C6 to C30 aryl group, a C7 to C30 arylalkyl group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C30 heteroaryl group, or a combination thereof.

The substituted biphenylene structural unit may be represented by Chemical Formula 1:

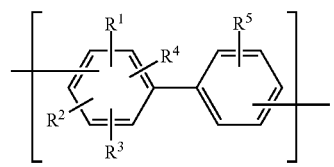

[Chemical Formula 1]

wherein, in Chemical Formula 1, $R^1$ to $R^5$ may each independently be hydrogen, deuterium, a halogen, a hydroxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 hetero alkyl group, a substituted or unsubstituted C3 to C30 cycloalkyl group, a substituted or unsubstituted C1 to C30 heterocycloalkyl group, a substituted or unsubstituted C1 to C30 arylalkyl group, a substituted or unsubstituted C6 to C30 heteroarylalkyl group, a substituted or unsubstituted C6 to C30 aryl group, a substituted or unsubstituted C3 to C30 heteroaryl group, or a combination thereof, and at least one of $R^1$ to $R^5$ may be a hydroxy-substituted C6 to C30 aryl group or a hydroxy-substituted C3 to C30 heteroaryl group.

At least one of $R^1$ to $R^4$ may be a hydroxy-substituted C6 to C30 aryl group or a hydroxy-substituted C3 to C30 heteroaryl group.

One or two of $R^1$ to $R^4$ may be a hydroxy-substituted C6 to C30 aryl group or a hydroxy-substituted C3 to C30 heteroaryl group.

The structural unit represented by Chemical Formula 1 may be represented by one of Chemical Formulae 1-1 to 1-4:

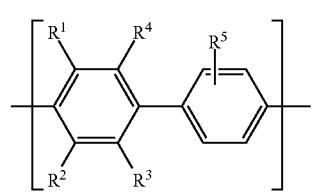

[Chemical Formula 1-1]

[Chemical Formula 1-2]

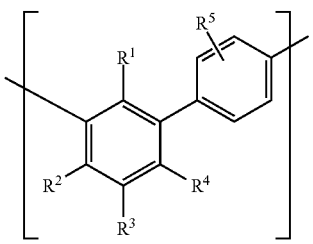

[Chemical Formula 1-3]

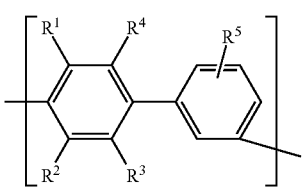

[Chemical Formula 1-4]

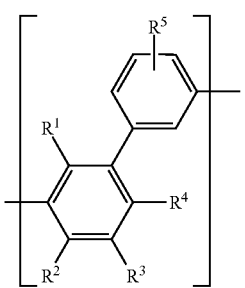

wherein, in Chemical Formula 1-1 to Chemical Formula 1-4, $R^1$ to $R^5$ may be each independently hydrogen, deuterium, a halogen, a hydroxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 heteroalkyl group, a substituted or unsubstituted C3 to C30 cycloalkyl group, a substituted or unsubstituted C1 to C30 heterocycloalkyl group, a substituted or unsubstituted C1 to C30 arylalkyl group, a substituted or unsubstituted C6 to C30 heteroarylalkyl group, a substituted or unsubstituted C6 to C30 aryl group, a substituted or unsubstituted C3 to C30 heteroaryl group, or a combination thereof, and at least one of $R^1$ to $R^5$ may be a hydroxy-substituted C6 to C30 aryl group or a hydroxy-substituted C3 to C30 heteroaryl group.

The structural unit represented by Chemical Formula 1-1 may be represented by Chemical Formula 1-1a, and the structural unit represented by Chemical Formula 1-2 may be represented by Chemical Formula 1-2a:

[Chemical Formula 1-1a]

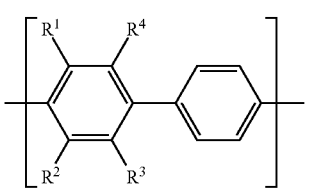

[Chemical Formula 1-2a]

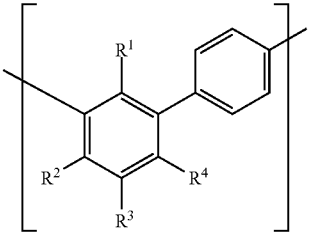

wherein, in Chemical Formula 1-1a and Chemical Formula 1-2a, $R^1$ to $R^4$ may be each independently hydrogen, deuterium, a halogen, a hydroxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 hetero alkyl group, a substituted or unsubstituted C3 to C30 cycloalkyl group, a substituted or unsubstituted C1 to C30 heterocycloalkyl group, a substituted or unsubstituted C1 to C30 arylalkyl group, a substituted or unsubstituted C6 to C30 heteroarylalkyl group, a substituted or unsubstituted C6 to C30 aryl group, a substituted or unsubstituted C3 to C30 heteroaryl group, or a combination thereof, and at least one of $R^1$ to $R^4$ may be a hydroxy-substituted C6 to C30 aryl group or a hydroxy-substituted C3 to C30 heteroaryl group.

The structural unit represented by Chemical Formula 1-3 may be represented by Chemical Formula 1-3a, and the structural unit represented by Chemical Formula 1-4 may be represented by Chemical Formula 1-4a:

[Chemical Formula 1-3a]

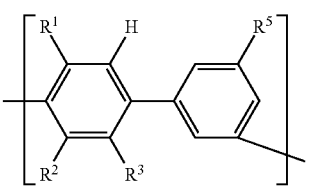

[Chemical Formula 1-4a]

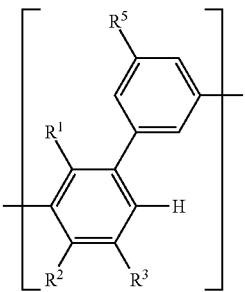

wherein, in Chemical Formula 1-3a and Chemical Formula 1-4a, $R^1$ to $R^3$ and $R^5$ may be each independently hydrogen, deuterium, a halogen, a hydroxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 heteroalkyl group, a substituted or unsubstituted C3 to C30 cycloalkyl group, a substituted or unsubstituted C1 to C30 heterocycloalkyl group, a substituted or unsubstituted C1 to C30 arylalkyl group, a substituted or unsubstituted C6 to C30 heteroarylalkyl group, a substituted or unsubstituted C6 to C30 aryl group, a substituted or unsubstituted C3 to C30 heteroaryl group, or a combination thereof, and at least one of $R^1$ to $R^3$ and $R^5$ may be a hydroxy-substituted C6 to C30 aryl group or a hydroxy-substituted C3 to C30 heteroaryl group.

The substituted biphenylene structural unit may be represented by Chemical Formula 2:

[Chemical Formula 2]

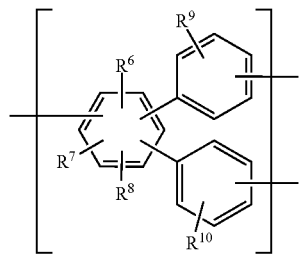

wherein, in Chemical Formula 2, $R^6$ to $R^{10}$ may be each independently hydrogen, deuterium, a halogen, a hydroxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 hetero alkyl group, a substituted or unsubstituted C3 to C30 cycloalkyl group, a substituted or unsubstituted C1 to C30 heterocycloalkyl group, a substituted or unsubstituted C1 to C30 arylalkyl group, a substituted or unsubstituted C6 to C30 heteroarylalkyl group, a substituted or unsubstituted C6 to C30 aryl group, a substituted or unsubstituted C3 to C30 heteroaryl group, or a combination thereof, and at least one of $R^6$ to $R^{10}$ may be a hydroxy-substituted C6 to C30 aryl group or a hydroxy-substituted C3 to C30 heteroaryl group.

At least one of $R^6$ to $R^8$ may be a hydroxy-substituted C6 to C30 aryl group or a hydroxy-substituted C3 to C30 heteroaryl group.

One or two of $R^6$ to $R^8$ may be a hydroxy-substituted C6 to C30 aryl group or a hydroxy-substituted C3 to C30 heteroaryl group.

The structural unit represented by Chemical Formula 2 may be represented by
Chemical Formula 2-1:

[Chemical Formula 2-1]

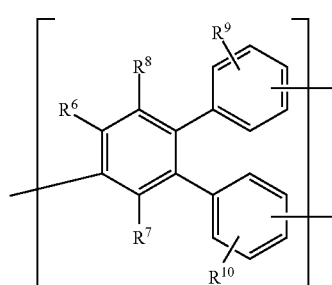

wherein, in Chemical Formula 2-1, $R^6$ to $R^{10}$ may be each independently hydrogen, deuterium, a halogen, a hydroxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 hetero alkyl group, a substituted or unsubstituted C3 to C30 cycloalkyl group, a substituted or unsubstituted C1 to C30 heterocycloalkyl group, a substituted or unsubstituted C1 to C30 arylalkyl group, a substituted or unsubstituted C6 to C30 heteroarylalkyl group, a substituted or unsubstituted C6 to C30 aryl group, a substituted or unsubstituted C3 to C30 heteroaryl group, or a combination thereof, and at least one of $R^6$ to $R^{10}$ may be a hydroxy-substituted C6 to C30 aryl group or a hydroxy-substituted C3 to C30 heteroaryl group.

The structural unit represented by Chemical Formula 2-1 may be represented by Chemical Formula 2-1a:

[Chemical Formula 2-1a]

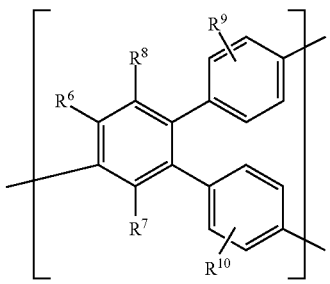

wherein, in Chemical Formula 2-1a, $R^6$ to $R^{10}$ may be each independently hydrogen, deuterium, a halogen, a hydroxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 hetero alkyl group, a substituted or unsubstituted C3 to C30 cycloalkyl group, a substituted or unsubstituted C1 to C30 heterocycloalkyl group, a substituted or unsubstituted C1 to C30 arylalkyl group, a substituted or unsubstituted C6 to C30 heteroarylalkyl group, a substituted or unsubstituted C6 to C30 aryl group, a substituted or unsubstituted C3 to C30 heteroaryl group, or a combination thereof, and at least one of $R^6$ to $R^{10}$ may be a hydroxy-substituted C6 to C30 aryl group or a hydroxy-substituted C3 to C30 heteroaryl group.

The embodiments may be realized by providing a hardmask layer comprising a cured product of the hardmask composition according to an embodiment.

The cured product may include a condensed polycyclic aromatic hydrocarbon.

The embodiments may be realized by providing a method of forming patterns, the method including applying the hardmask composition according to an embodiment on a material layer and heat treating the same to form a hardmask layer, forming a photoresist layer on the hardmask layer, exposing and developing the photoresist layer to form a photoresist pattern, selectively removing the hardmask layer using the photoresist pattern to expose a part of the material layer, and etching an exposed part of the material layer.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. As used herein, the term "or" is not an exclusive term, and includes any combination of elements listed therewith.

Hereinafter, as used herein, when a definition is not otherwise provided, 'substituted' may refer to replacement of a hydrogen atom of a compound by a substituent selected from deuterium, a halogen atom (F, Br, Cl, or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C30 heterocyclic group, and a combination thereof.

In addition, adjacent two substituents of the substituted halogen atom (F, Br, Cl, or I), the hydroxy group, the nitro group, the cyano group, the amino group, the azido group, the amidino group, the hydrazino group, the hydrazono group, the carbonyl group, the carbamyl group, the thiol group, the ester group, the carboxyl group or the salt thereof, the sulfonic acid group or the salt thereof, the phosphoric acid or the salt thereof, the C1 to C30 alkyl group, the C2 to C30 alkenyl group, the C2 to C30 alkynyl group, the C6 to C30 aryl group, the C7 to C30 arylalkyl group, the C1 to C30 alkoxy group, the C1 to C20 heteroalkyl group, the C3 to C20 heteroarylalkyl group, the C3 to C30 cycloalkyl group, the C3 to C15 cycloalkenyl group, the C6 to C15 cycloalkynyl group, the C2 to C30 heterocyclic group may be fused to form a ring. For example, the substituted C6 to C30 aryl group may be fused with another adjacent substituted C6 to C30 aryl group to form a substituted or unsubstituted fluorene ring.

As used herein, when a definition is not otherwise provided, 'hetero' may refer to one including 1 to 3 heteroatoms selected from N, O, S, Se, and P.

As used herein, an "aryl group" refers to a group including at least one hydrocarbon aromatic moiety, and includes hydrocarbon aromatic moieties linked by a single bond and hydrocarbon aromatic moieties fused directly or indirectly to provide a non-aromatic fused ring. The aryl group may include a monocyclic, polycyclic or fused polycyclic (i.e., rings sharing adjacent pairs of carbon atoms) functional group.

As used herein, "heterocyclic group" is a concept including a heteroaryl group, and may include at least one hetero atom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

For example, the substituted or unsubstituted aryl group and/or the substituted or unsubstituted heterocyclic group may be a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenyl group, a substituted or unsubstituted terphenyl group, a substituted or unsubstituted quaterphenyl group, a substituted or unsubstituted chrysenyl group, a substituted or unsubstituted triphenylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridinyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted fluorenyl group, a substituted or unsubstituted dibenzofuranyl group, a substituted or unsubstituted dibenzothiophenyl group, a substituted or unsubstituted carbazolyl group, pyridoindolyl group, benzopyridooxazinyl group, benzopyridothiazinyl group, 9,9-dimethyl-9,10-dihydroacridinyl group, a combination thereof, or a combined fused ring of the foregoing groups. In one example, the heterocyclic group or the heteroaryl group may be a pyridyl group, a carbazolyl group, or a pyridoindolyl group.

In addition, as used herein, a polymer may refer to an oligomer and a polymer.

Hereinafter, a hardmask composition according to an embodiment is described.

The hardmask composition according to an embodiment may include, e.g., a polymer and a solvent.

The polymer may include polyphenylene in which phenylene moieties are sequentially linked one another as a main chain or backbone. In an implementation, at least a part of each phenylene may be substituted with at least one substituent. In an implementation, the substituent may include, e.g., a substituted or unsubstituted C6 to C30 aryl group or a substituted or unsubstituted C3 to C30 heteroaryl group. In an implementation, the substituent may include, e.g., a C6 to C30 aryl group having at least one hydroxy group (a hydroxy-substituted C6 to C30 aryl group) or a C3 to C30 heteroaryl group having at least one hydroxy group (a hydroxy-substituted C3 to C30 heteroaryl group).

In an implementation, the polymer may include a plurality of structural units (e.g., repeating units). In an implementation, the structural unit may include, e.g., a substituted biphenylene structural unit.

The substituted biphenylene structural unit may include biphenylene as a main backbone. In an implementation, at least one part of each phenylene of biphenylene may have a structure substituted with at least one substituent. In an implementation, the substituent may be or include, e.g., deuterium, a halogen, a hydroxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 heteroalkyl group, a substituted or unsubstituted C3 to C30 cycloalkyl group, a substituted or unsubstituted C1 to C30 heterocycloalkyl group, a substituted or unsubstituted C1 to C30 arylalkyl group, a substituted or unsubstituted C6 to C30 heteroarylalkyl group, a substituted or unsubstituted C6 to C30 aryl group, a substituted or unsubstituted C3 to C30 heteroaryl group, or a combination thereof.

In an implementation, the at least one part of each phenylene of biphenylene may be substituted with at least one of a substituted or unsubstituted C6 to C30 aryl group and a substituted or unsubstituted C3 to C30 heteroaryl group. In an implementation, the aryl group may be, e.g., a non-condensed aryl group and/or a condensed aryl group and the heteroaryl group may be a non-condensed heteroaryl group and/or a condensed heteroaryl group. For example, the aryl group may be a monocyclic aryl group and/or a polycyclic aryl group and the heteroaryl group may be a monocyclic heteroaryl group and/or a polycyclic heteroaryl group.

In an implementation, the one phenylene may be substituted with, at least one of a substituted or unsubstituted phenyl group, a substituted or unsubstituted naphthyl group, a substituted or unsubstituted biphenyl group, a substituted or unsubstituted diphenylfluorenyl group, a substituted or unsubstituted dinaphthylfluorenyl group, a substituted or unsubstituted anthracenyl group, a substituted or unsubstituted fluoranthenyl group, a substituted or unsubstituted acenaphthylenyl group, a substituted or unsubstituted acenaphthenyl group, a substituted or unsubstituted phenanthrenyl group, a substituted or unsubstituted benzophenanthrenyl group, a substituted or unsubstituted pyrenyl group, a substituted or unsubstituted triphenylenyl group, a substituted or unsubstituted chrysenyl group, a substituted or unsubstituted tetracenyl group, a substituted or unsubstituted benzofluoranthenyl group, a substituted or unsubstituted perlenyl group, a substituted or unsubstituted benzopyrenyl group, a substituted or unsubstituted naphthoanthracenyl group, a substituted or unsubstituted pentacenyl group, a substituted or unsubstituted benzoperlenyl group, a substituted or unsubstituted dibenzopyrenyl group, a substituted or unsubstituted coronenyl group, a substituted or unsubstituted pyridinyl group, a substituted or unsubstituted pyrimidinyl group, a substituted or unsubstituted triazinyl group, a substituted or unsubstituted pyrrolyl group, a substituted or unsubstituted imidazolyl group, a substituted or unsubstituted pyrazolyl group, a substituted or unsubstituted indolo group, a substituted or unsubstituted isoindolo group, a substituted or unsubstituted benzimidazolyl group, a substituted or unsubstituted indazolyl group, a substituted or unsubstituted furanyl group, a substituted or unsubstituted benzofuranyl group, a substituted or unsubstituted thiophenyl group, a substituted or unsubstituted oxazolyl group, and a substituted or unsubstituted thiazolyl group.

In an implementation, the one phenylene may be substituted with at least one of a C6 to C30 aryl group having at least one hydroxy group (a hydroxy-substituted C6 to C30 aryl group) or a C3 to C30 heteroaryl group having at least one hydroxy group (a hydroxy-substituted C3 to C30 heteroaryl group).

In an implementation, the one phenylene may be substituted with, at leaset one of a hydroxyphenyl group, a hydroxynaphthyl group, a hydroxybiphenyl group, a hydroxydiphenylfluorenyl group, a hydroxydinaphthylfluorenyl group, a hydroxyanthracenyl group, a hydroxyfluoranthenyl group, a hydroxyacenaphthylenyl group, a hydroxyacenaphthenyl group, a hydroxyphenanthrenyl group, a hydroxybenzophenanthrenyl group, a hydroxypyrenyl group, a hydroxytriphenylenyl group, a hydroxychrysenyl group, a hydroxytetracenyl group, a hydroxybenzofluoranthenyl group, a hydroxyperlenyl group, a hydroxybenzopyrenyl group, a hydroxynaphthoanthracenyl group, a hydroxypentacenyl group, a hydroxybenzoperlenyl group, a hydroxydibenzopyrenyl group, a hydroxycoronenyl group, a hydroxypyridinyl group, a hydroxypyrimidinyl group, a hydroxy triazinyl group, a hydroxypyrrolyl group, a hydroxy imidazolyl group, a hydroxypyrazolyl group, a hydroxyindolo group, a hydroxyisoindolo group, a hydroxybenzimidazolyl group, a hydroxy indazolyl group, a hydroxyfuranyl group, a hydroxybenzofuranyl group, a hydroxythiophenyl group, a hydroxyoxazolyl group, a hydroxythiazolyl group, a dihydroxyphenyl group, a dihydroxynaphthyl group, a dihydroxybiphenyl group, a dihydroxydiphenylfluorenyl group, a dihydroxydinaphthylfluorenyl group, a dihydroxyanthracenyl group, a dihydroxyfluoranthenyl group, a dihydroxyacenaphthylenyl group, a dihydroxyacenaphthenyl group, a dihydroxyphenanthrenyl group, a dihydroxybenzophenanthrenyl group, a dihydroxypyrenyl group, a dihydroxytriphenylenyl group, a dihydroxychrysenyl group, a dihydroxytetracenyl group, a dihydroxybenzofluoranthenyl group, a dihydroxyperlenyl group, a dihydroxybenzopyrenyl group, a dihydroxynaphthoanthracenyl group, a dihydroxypentacenyl group, a dihydroxybenzoperlenyl group, a dihydroxydibenzopyrenyl group, a dihydroxycoronenyl group, a dihydroxypyridinyl group, a dihydroxypyrimidinyl group, a dihydroxytriazinyl group, a dihydroxypyrrolyl group, a dihydroxyimidazolyl group, a dihydroxypyrazolyl group, a dihydroxyindolo group, a dihydroxyisoindolo group, a dihydroxybenzimidazolyl group, a dihydroxyindazolyl group, a dihydroxyfuranyl group, a dihydroxybenzofuranyl group, a dihydroxythiophenyl group, a dihydroxyoxazolyl group, and a dihydroxythiazolyl group.

In an implementation, the one phenylene may be substituted with at least one of a hydroxy-substituted C6 to C30 aryl group and a hydroxy-substituted C3 to C30 heteroaryl group and may be further substituted with, at least one of deuterium, a halogen, a hydroxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 heteroalkyl group, a substituted or unsubstituted C3 to C30 cyclo alkyl group, a substituted or unsubstituted C1 to C30 heterocycloalkyl group, a substituted or unsubstituted C1 to C30 arylalkyl group, a substituted or unsubstituted C6 to C30 heteroarylalkyl group, a substituted or unsubstituted C6 to C30 aryl group, a substituted or unsubstituted C3 to C30 heteroaryl group, and a combination thereof.

In an implementation, the one phenylene may be substituted with at least one of a hydroxy-substituted C6 to C30 aryl group and a hydroxy-substituted C3 to C30 heteroaryl group and may be further substituted with, e.g., a substituted or unsubstituted C6 to C30 aryl group or a substituted or unsubstituted C3 to C30 heteroaryl group.

In an implementation, the one phenylene may be substituted with, at leaset one of a hydroxy-substituted C6 to C30 non-condensed aryl group and a hydroxy-substituted C3 to C30 non-condensed heteroaryl group.

In an implementation, the hydroxy-substituted C6 to C30 non-condensed aryl group may include, e.g., a hydroxyphenyl group, a hydroxybiphenyl group, a hydroxyterphenyl group, a hydroxyquaterphenyl group, a dihydroxyphenyl group, a dihydroxybiphenyl group, a dihydroxyterphenyl group, a dihydroxyquaterphenyl group, or a combination thereof.

In an implementation, the hydroxy-substituted C3 to C30 non-condensed heteroaryl group may include, e.g., a hydroxypyrimidinyl group, a hydroxypyridinyl group, a hydroxytriazinyl group, a hydroxypyrrolyl group, a hydroxyimidazolyl group, a hydroxypyrazolyl group, a hydroxyfuranyl group, a hydroxythiophenyl group, a hydroxyoxazolyl group, a hydroxythiazolyl group, a dihydroxypyrimidinyl group, a dihydroxypyridinyl group, a dihydroxytriazinyl group, a dihydroxypyrrolyl group, a dihydroxyimidazolyl group, a dihydroxypyrazolyl group, a dihydroxyfuranyl group, a dihydroxythiophenyl group, a dihydroxyoxazolyl group, a dihydroxythiazolyl group, or a combination thereof.

The polymer according to an embodiment may include a substituted polyphenylene, e.g., the substituted biphenylene structural unit as a main chain, and may form a fused structure through a reaction of the polyphenylene forming the main chain with the substituents linked therewith during curing of the polymer. For example, the polymer may form a hard layer including a condensed polycyclic aromatic hydrocarbon.

In an implementation, the substituted biphenylene structural unit may be substituted with a substituent having at least one hydroxy group. A polymer having such a structural unit may exhibit increased solubility in a solvent and may be further effectively applied to a solution process such as spin coating. In addition, a polymer having such a structural unit may exhibit increased affinity with respect to an underlying layer during coating and curing and may exhibit high etch resistance and chemical resistance with respect to an etching gas and a chemical solution exposed in a subsequent process such as an etching process. A composition according to an embodiment may further improve flatness of a hardmask layer formed thereof.

The substituents of the substituted biphenylene structural unit may be independently present or may be linked one another and thus formed into a cycle. When independently present, a high rotational degree of freedom of the polymer may be secured, and high solubility in a solvent may not only be further increased, but also much higher etch resistance and chemical resistance may be obtained after a cyclization dehydrogenation reaction in a subsequent heat treatment process.

In an implementation, the polymer may include a plurality of the same or different structural units. In an implementation, the polymer may have a structure in which the same structural units are sequentially linked one another (e.g., the same repeating units).

In an implementation, the polymer may be a linear polymer, a branched polymer, or a combination thereof.

In an implementation, the one phenylene of the substituted biphenylene structural unit may further include, e.g., a substituted or unsubstituted C6 to C30 aryl group and a substituted or unsubstituted C3 to C30 heteroaryl group and at least one hydrogen of the substituted C6 to C30 aryl group and substituted C3 to C30 heteroaryl group may be replaced by one of deuterium, a halogen, a nitro group, a cyano group, an amino group, a C1 to C30 alkyl group, a C2 to C30 alkenyl group, a C2 to C30 alkynyl group, a C6 to C30 aryl group, a C7 to C30 arylalkyl group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C30 heteroaryl group, or a combination thereof.

In an implementation, the substituted biphenylene structural unit may further include, e.g., a substituted or unsubstituted C6 to C30 non-condensed aryl group or a substituted or unsubstituted C3 to C30 non-condensed heteroaryl group.

In an implementation, a substituent of the substituted C6 to C30 non-condensed aryl group and substituted C3 to C30 non-condensed heteroaryl group may include, e.g., deuterium, a halogen, a nitro group, a cyano group, an amino group, a C1 to C30 alkyl group, a C2 to C30 alkenyl group, a C2 to C30 alkynyl group, a C6 to C30 aryl group, a C7 to C30 arylalkyl group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C30 heteroaryl group, or a combination thereof.

In an implementation, the substituted or unsubstituted C6 to C30 non-condensed aryl group may be, e.g., a substituted or unsubstituted phenyl group, a substituted or unsubstituted biphenyl group, a substituted or unsubstituted terphenyl group, a substituted or unsubstituted quaterphenyl group, or a combination thereof.

In an implementation, the substituted or unsubstituted C3 to C30 non-condensed heteroaryl group may be, e.g., a substituted or unsubstituted pyrimidinyl group, a substituted or unsubstituted pyridinyl group, a substituted or unsubstituted triazinyl group, a substituted or unsubstituted pyrrolyl group, a substituted or unsubstituted imidazolyl group, a substituted or unsubstituted pyrazolyl group, a substituted or unsubstituted furanyl group, a substituted or unsubstituted thiophenyl group, a substituted or unsubstituted oxazolyl group, a substituted or unsubstituted thiazolyl group, or a combination thereof.

In an implementation, the polymer including the substituted biphenylene structural unit may be synthesized through, e.g., a Diels-Alder reaction and an elimination reaction by using a compound having substituted diene and a substituted ethynyl moiety as reactants and may include a functional group, for example, a hydroxy group which is disadvantageous for the Diels-Alder reaction.

In an implementation, the polymer may be obtained from, e.g., a compound including a C≡C triple bond and cyclopentadienone.

In an implementation, the polymer may include a structural unit represented by Chemical Formula 1.

[Chemical Formula 1]

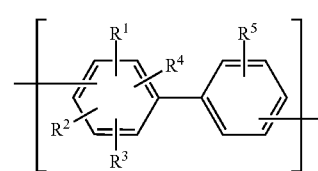

In Chemical Formula 1, $R^1$ to $R^5$ may each independently be or include, e.g., hydrogen, deuterium, a halogen, a hydroxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 heteroalkyl group, a substituted or unsubstituted C3 to C30 cycloalkyl group, a substituted or unsubstituted C1 to C30 heterocycloalkyl group, a substituted or unsubstituted C1 to C30 arylalkyl group, a substituted or unsubstituted C6 to C30 heteroarylalkyl group, a substituted or unsubstituted C6 to C30 aryl group, a substituted or unsubstituted C3 to C30 heteroaryl group, or a combination thereof.

At least one of $R^1$ to $R^5$ may be a hydroxy-substituted C6 to C30 aryl group or a hydroxy-substituted C3 to C30 heteroaryl group.

In an implementation, the polymer may include the structural unit represented by Chemical Formula 1 as a plurality of repeating units. In an implementation, the structural unit represented by Chemical Formula 1 including the plurality of repeating units may include a suitable number and arrangement of the repeating units. In an implementation, the number of the repeating units may be, e.g., about 2 to about 100.

In an implementation, $R^1$ to $R^5$ may be the same or different.

In an implementation, $R^1$ to $R^4$ may be the same or different.

In an implementation, $R^1$ to $R^5$ may be independently present or may be linked with each other to form a ring. In an implementation, $R^1$ to $R^5$ may be independently present.

In an implementation, at least one of $R^1$ to $R^4$ may be, e.g., a hydroxy-substituted C6 to C30 aryl group or a hydroxy-substituted C3 to C30 heteroaryl group.

In an implementation, at least one of $R^1$ to $R^4$ may be, e.g., a hydroxy-substituted C6 to C30 non-condensed aryl group or a hydroxy-substituted C3 to C30 non-condensed heteroaryl group.

In an implementation, one or two (e.g., only one or two of) of $R^1$ to $R^4$ may be, e.g., a hydroxy-substituted C6 to C30 aryl group or a hydroxy-substituted C3 to C30 heteroaryl group. For example, only one or two of $R^1$ to $R^4$ may be the hydroxy-substituted C6 to C30 aryl group or the hydroxy-substituted C3 to C30 heteroaryl group, and the remaining two or three of $R^1$ to $R^4$ may be a group other than a hydroxy-substituted C6 to C30 aryl group or a hydroxy-substituted C3 to C30 heteroaryl group.

In an implementation, one or more of $R^1$ to $R^4$ may be a hydroxy-substituted C6 to C30 non-condensed aryl group or a hydroxy-substituted C3 to C30 non-condensed heteroaryl group.

In an implementation, $R^5$ may be or may include, e.g., hydrogen, deuterium, a halogen, a nitro group, a cyano group, an amino group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C7 to C30 arylalkyl group, a substituted or unsubstituted C1 to C20 heteroalkyl group, a substituted or unsubstituted C3 to C20 heteroarylalkyl group, a substituted or unsubstituted C3 to C30 cycloalkyl group, a substituted or unsubstituted C3 to C15 cycloalkenyl group, a substituted or unsubstituted C6 to C15 cycloalkynyl group, a substituted or unsubstituted C3 to C30 heteroaryl group, or a combination thereof. The "substituted" may refer to a substitution with, e.g., deuterium, a halogen, a nitro group, a cyano group, an amino group, a C1 to C30 alkyl group, a C2 to C30 alkenyl group, a C2 to C30 alkynyl group, a C6 to C30 aryl group, a C7 to C30 arylalkyl group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C30 heteroaryl group, or a combination thereof.

In an implementation, $R^5$ may be or may include, e.g., a substituted or unsubstituted C6 to C30 non-condensed aryl group or a substituted or unsubstituted C3 to C30 non-condensed heteroaryl group. The "substituted" in the substituted or unsubstituted C6 to C30 non-condensed aryl group and the substituted or unsubstituted C3 to C30 non-condensed heteroaryl group may refer to a substitution with, e.g., deuterium, a halogen, a nitro group, a cyano group, an amino group, a C1 to C30 alkyl group, a C2 to C30 alkenyl group, a C2 to C30 alkynyl group, a C6 to C30 aryl group, a C7 to C30 arylalkyl group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C30 heteroaryl group, or a combination thereof.

In an implementation, the structural unit represented by Chemical Formula 1 may be represented by, e.g., one of Chemical Formulae 1-1 to 1-4.

[Chemical Formula 1-1]

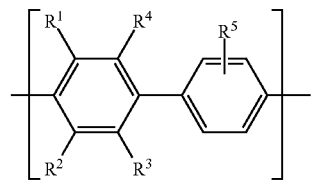

[Chemical Formula 1-2]

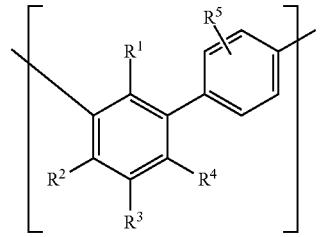

[Chemical Formula 1-3]

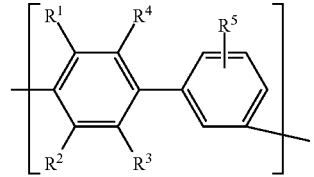

[Chemical Formula 1-4]

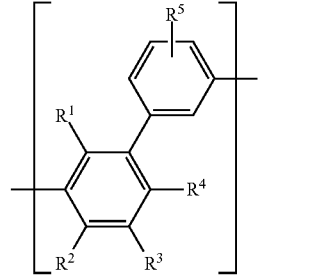

In Chemical Formula 1-1 to Chemical Formula 1-4, $R^1$ to $R^5$ may be the same as described above with respect to Chemical Formula 1.

In an implementation, in Chemical Formula 1-3 and Chemical Formula 1-4, $R^4$ may be, e.g., hydrogen or deuterium.

In an implementation, the structural unit represented by Chemical Formula 1-1 may be represented by Chemical Formula 1-1a and the structural unit represented by Chemical Formula 1-2 may be represented by Chemical Formula 1-2a.

[Chemical Formula 1-1a]

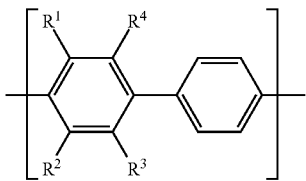

[Chemical Formula 1-2a]

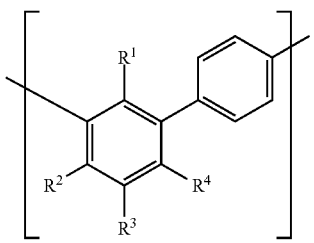

In Chemical Formula 1-1a and Chemical Formula 1-2a, $R^1$ to $R^4$ may be the same as described above.

In an implementation, the structural unit represented by Chemical Formula 1-3 may be represented by Chemical Formula 1-3a and the structural unit represented by Chemical Formula 1-4 may be represented by Chemical Formula 1-4a.

[Chemical Formula 1-3a]

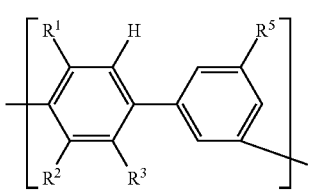

[Chemical Formula 1-4a]

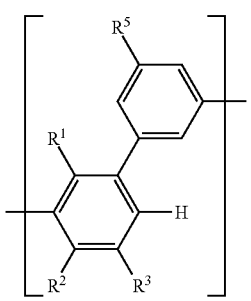

In Chemical Formula 1-3a and Chemical Formula 1-4a, $R^1$ to $R^3$ and $R^5$ may be the same as described above.

In an implementation, the polymer may include a structural unit represented by, e.g., Chemical Formula 2.

[Chemical Formula 2]

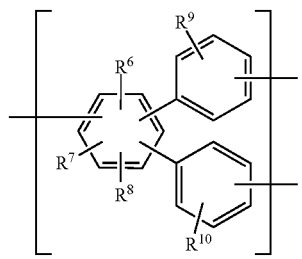

In Chemical Formula 2, $R^6$ to $R^{10}$ may each independently be or include, e.g., hydrogen, deuterium, a halogen, a hydroxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 heteroalkyl group, a substituted or unsubstituted C3 to C30 cycloalkyl group, a substituted or unsubstituted C1 to C30 heterocycloalkyl group, a substituted or unsubstituted C1 to C30 arylalkyl group, a substituted or unsubstituted C6 to C30 heteroarylalkyl group, a substituted or unsubstituted C6 to C30 aryl group, a substituted or unsubstituted C3 to C30 heteroaryl group, or a combination thereof.

At least one of $R^6$ to $R^{10}$ may be, e.g., a hydroxy-substituted C6 to C30 aryl group or a hydroxy-substituted C3 to C30 heteroaryl group.

In an implementation, the polymer may include at least one structural unit represented by Chemical Formula 2 as a plurality of repeating units. In an implementation, the structural unit represented by Chemical Formula 2 may be present as the plurality of repeating units, and may include a suitable number and arrangement of the repeating units. In an implementation, the number of the repeating units may be, e.g., about 2 to about 100.

In an implementation, $R^6$ to $R^{10}$ may be the same or different.

In an implementation, $R^6$ to $R^8$ may be the same or different.

In an implementation, $R^9$ and $R^{10}$ may be the same or different.

In an implementation, $R^6$ to $R^{10}$ may be independently present or may be linked with each other to form a ring. In an implementation, $R^6$ to $R^{10}$ may be independently present.

In an implementation, at least one of $R^6$ to $R^8$ may be, e.g., a hydroxy-substituted C6 to C30 aryl group or a hydroxy-substituted C3 to C30 heteroaryl group.

In an implementation, at least one of $R^6$ to $R^8$ may be a hydroxy-substituted C6 to C30 non-condensed aryl group or a hydroxy-substituted C3 to C30 non-condensed heteroaryl group.

In an implementation, one or two of (e.g., only one or two of) $R^6$ to $R^8$ may be a hydroxy-substituted C6 to C30 aryl group or a hydroxy-substituted C3 to C30 heteroaryl group. For example, only one or two of $R^6$ to $R^8$ may be the hydroxy-substituted C6 to C30 aryl group or the hydroxy-substituted C3 to C30 heteroaryl group, and the remaining one or two of $R^6$ to $R^8$ may be a group other than a hydroxy-substituted C6 to C30 aryl group or a hydroxy-substituted C3 to C30 heteroaryl group.

In an implementation, one or two of (e.g., only one or two of) $R^6$ to $R^8$ may be a hydroxy-substituted C6 to C30 non-condensed aryl group or a hydroxy-substituted C3 to C30 non-condensed heteroaryl group.

In an implementation, $R^9$ and $R^{10}$ may each independently be or include, e.g., hydrogen, deuterium, a halogen, a nitro group, a cyano group, an amino group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C7 to C30 arylalkyl group, a substituted or unsubstituted C1 to C20 heteroalkyl group, a substituted or unsubstituted C3 to C20 heteroarylalkyl group, a substituted or unsubstituted C3 to C30 cycloalkyl group, a substituted or unsubstituted C3 to C15 cycloalkenyl group, a substituted or unsubstituted C6 to C15 cycloalkynyl group, a substituted or unsubstituted C3 to C30 heteroaryl group, or a combination thereof, wherein the "substituted" may refer to a substitution with a substituent selected from deuterium, a halogen, a nitro group, a cyano group, an amino group, a C1 to C30 alkyl group, a C2 to C30 alkenyl group, a C2 to C30 alkynyl group, a C6 to C30 aryl group, a C7 to C30 arylalkyl group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C30 heteroaryl group, or a combination thereof.

In an implementation, $R^9$ and $R^{10}$ may each independently be or include, e.g., a substituted or unsubstituted C6 to C30 non-condensed aryl group or a substituted or unsubstituted C3 to C30 non-condensed heteroaryl group. The "substituted" in the substituted or unsubstituted C6 to C30 non-condensed aryl group and the substituted or unsubstituted C3 to C30 non-condensed heteroaryl group may refer to a substitution with, e.g., deuterium, a halogen, a nitro group, a cyano group, an amino group, a C1 to C30 alkyl group, a C2 to C30 alkenyl group, a C2 to C30 alkynyl group, a C6 to C30 aryl group, a C7 to C30 arylalkyl group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C30 heteroaryl group, or a combination thereof.

In an implementation, the structural unit represented by Chemical Formula 2 may be represented by Chemical Formula 2-1.

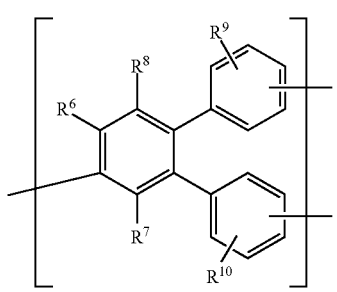

[Chemical Formula 2-1]

In Chemical Formula 2-1, $R^6$ to $R^{10}$ may be the same as described above.

In an implementation, in Chemical Formula 2-1, $R^9$ and $R^{10}$ may each independently be, e.g., hydrogen or deuterium.

In an implementation, the structural unit represented by Chemical Formula 2-1 may be represented by Chemical Formula 2-1a.

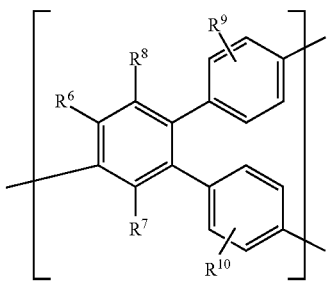

[Chemical Formula 2-1a]

In Chemical Formula 2-1a, $R^6$ to $R^{10}$ may be the same as described above.

The polymer may have a weight average molecular weight of, e.g., about 500 to about 100,000. In an implementation, the polymer may have a weight average molecular weight of, e.g., about 500 to about 10,000, about 800 to about 5,000, or about 1,000 to about 3,000. When the polymer has a weight average molecular weight within the ranges, the hardmask composition including the polymer may be optimized by adjusting the amount of carbon and solubility in a solvent.

The solvent used in the hardmask composition may be a suitable solvent having sufficient dissolubility or dispersibility with respect to the polymer. In an implementation, the solvent may include, e.g., propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyl lactate, gamma-butyrolactone, N,N-dimethyl formamide, N,N-dimethyl acetamide, methyl pyrrolidone, methyl pyrrolidinone, acetylacetone, or ethyl 3-ethoxypropionate.

In an implementation, the polymer may be included in an amount of, e.g., about 0.1 wt % to about 50 wt %, about 0.5 wt % to about 40 wt %, about 1 wt % to about 30 wt %, or about 2 wt % to 20 wt %, based on a total weight of the total amount of the hardmask composition. When the polymer is included within the ranges, a thickness, surface roughness and planarization of the hardmask may be controlled.

In an implementation, the hardmask composition may further include an additive of, e.g., a surfactant, a cross-linking agent, a thermal acid generator, or a plasticizer.

In an implementation, the surfactant may include, e.g., a fluoroalkyl compound, an alkylbenzene sulfonate salt, an alkyl pyridinium salt, polyethylene glycol, or a quaternary ammonium salt.

In an implementation, the cross-linking agent may include, e.g., a melamine, a substituted urea, or a polymer cross-linking agent. In an implementation, it may be a cross-linking agent having at least two cross-linking forming substituents, e.g., methoxymethylated glycoluril, butoxymethylated glycoluril, methoxymethylated melamine, butoxymethylated melamine, methoxymethylated benzoguanamine, butoxymethylated benzoguanamine, methoxymethylatedurea, butoxymethylatedurea, methoxymethylated thiourea, or butoxymethylated thiourea, or the like.

The cross-linking agent may be a cross-linking agent having high heat resistance. The cross-linking agent having high heat resistance may be a compound including a cross-linking substituent including an aromatic ring (e.g. a benzene ring or a naphthalene ring) in the molecule.

The thermal acid generator may include, e.g., an acidic compound such as p-toluene sulfonic acid, trifluoromethane sulfonic acid, pyridinium p-toluene sulfonic acid, salicylic acid, sulfosalicylic acid, citric acid, benzoic acid, hydroxybenzoic acid, naphthalene carbonic acid, and the like or/and 2,4,4,6-tetrabromocyclohexadienone, benzointosylate, 2-nitrobenzyltosylate, other organosulfonic acid alkylester, or the like.

The additive may be included in an amount of, e.g., about 0.001 to 40 parts by weight, about 0.01 to 30 parts by weight, or about 0.1 to 20 parts by weight, based on 100 parts by weight of the hardmask composition. Within the ranges, solubility may be improved while optical properties of the hardmask composition are not changed.

Another embodiment may provide an organic layer manufactured using the hardmask composition. The organic layer may be, e.g., formed by coating the hardmask composition on a substrate and heat-treating it for curing. The organic layer may include, e.g., a hardmask layer, a planarization layer, a sacrificial layer, a filler, or the like, for an electronic device.

Another embodiment may provide a hardmask layer as a cured product of the aforementioned hardmask composition.

In an implementation, the cured product may include a condensed polycyclic aromatic hydrocarbon.

In an implementation, the condensed polycyclic aromatic hydrocarbon may include, e.g., substituted or unsubstituted naphthalene, substituted or unsubstituted anthracene, substituted or unsubstituted phenanthrene, substituted or unsubstituted naphthacene, a substituted or unsubstituted pyrene, a substituted or unsubstituted chrysene, a substituted or unsubstituted triphenylene, a substituted or unsubstituted perylene, a combination thereof, or a combined fused ring of the foregoing groups.

In an implementation, the cured product may further include a heterocycle.

The cured product may include condensed polycyclic aromatic hydrocarbons, and thus may exhibit high etch resistance and chemical resistance so as to withstand etching gases and chemical solutions exposed tehreto in subsequent processes including etching processes.

Hereinafter, a method of forming patterns using the aforementioned hardmask composition is described.

A method of forming patterns according to an embodiment may include, e.g., forming a material layer on a substrate, applying a hardmask composition including the aforementioned polymer and solvent on the material layer, heat-treating the hardmask composition to form a hardmask layer, forming a photoresist layer on the hardmask layer, exposing and developing the photoresist layer to form a photoresist pattern, selectively removing the hardmask layer using the photoresist pattern to expose a part of the material layer, and etching the exposed part of the material layer.

The substrate may be, e.g., a silicon wafer, a glass substrate, or a polymer substrate.

The material layer may be a material to be finally patterned, e.g., a metal layer such as an aluminum layer and a copper layer, a semiconductor layer such as a silicon layer, or an insulation layer such as a silicon oxide layer and a silicon nitride layer. The material layer may be formed through a method such as a chemical vapor deposition (CVD) process.

The hardmask composition may be the same as described above, and may be applied by spin-on coating in a form of a solution. In an implementation, a thickness of the applied hardmask composition may be, e.g., about 50 Å to 200,000 Å.

The heat-treating of the hardmask composition may be performed, e.g., at about 100° C. to about 700° C. for about 10 seconds to about 1 hour.

In an implementation, the method may further include forming a silicon-containing thin layer on the hardmask layer. The silicon-containing thin layer may be formed of, e.g., SiCN, SiOC, SiON, SiOCN, SiC, SiO, SiN, or the like.

In an implementation, the method may further include forming a bottom antireflective coating (BARC) on the silicon-containing thin layer or on the hardmask layer before forming the photoresist layer.

Exposure of the photoresist layer may be performed using, e.g. ArF, KrF, or EUV. After exposure, heat-treating may be performed at about 100° C. to about 700° C.

The etching process of the exposed part of the material layer may be performed through a dry etching process using an etching gas and the etching gas may include, e.g., $CHF_3$, $CF_4$, $Cl_2$, $BCl_3$, or a mixed gas thereof.

The etched material layer may be formed in a plurality of patterns. The plurality of patterns may include, e.g., a metal pattern, a semiconductor pattern, an insulation pattern, or the like. The plurality of patterns may include, e.g., diverse patterns of a semiconductor integrated circuit device.

Hereinafter, the embodiments are illustrated in more detail with reference to examples. However, these examples are exemplary, and the present scope is not limited thereto.

The following Examples and Reference Examples are provided in order to highlight characteristics of one or more embodiments, but it will be understood that the Examples and Reference Examples are not to be construed as limiting the scope of the embodiments, nor are the Reference Examples to be construed as being outside the scope of the embodiments. Further, it will be understood that the embodiments are not limited to the particular details described in the Examples and Reference Examples.

Synthesis of Intermediate

Synthesis Example 1: Synthesis of 1-Bromo-4-(2-phenylethynyl)benzene

After putting a stirring bar in a 1 L round-bottomed flask dried in a vacuum oven, bis(triphenylphosphine)palladium (II) dichloride (1.4 g), copper iodide (I) (0.38 g), and 0.4 L of a triethylamine/tetrahydrofuran mixed solvent (volume ratio of 1:1) were put therein and then, bubbled with nitrogen gas for 30 minutes. Subsequently, 1-bromo-4-iodobenzene (28.3 g) and phenylacetylene (12.3 g) were added thereto, and the obtained mixture was stirred and reacted under a nitrogen atmosphere for 24 hours. Then, the mixture was filtered and concentrated and then, purified through silica gel column chromatography using hexane as an eluant to obtain 1-bromo-4-(2-phenylethynyl)benzene. (Yield: 99%) ($^1$H NMR (300 MHz, DMSO-do) δ(ppm): 7.64 (d, $^3J_{HH}$=8.4 Hz, 2H), 7.57 (m, 2H), 7.51 (d, =8.4 Hz, 2H), 7.44 (m, 3H))

Synthesis Example 2: Synthesis of 4-[2-(4-Bromophenyl)ethynyl]phenol

4-[2-(4-Bromophenyl)ethynyl]phenol was obtained according to the same method as Synthesis Example 1 except that 4-ethynylphenol (14.2 g) instead of the phenylacetylene (12.3 g) was used for the synthesis, and a hexane/ethyl acetate mixed solvent instead of hexane as an eluant was used to purify a mixture. (Yield: 90%)

Synthesis Example 3: Synthesis of 1-Bromo-3-(2-phenylethynyl)benzene

1-Bromo-3-(2-phenylethynyl)benzene was obtained according to the same method as Synthesis Example 1 except that 1-bromo-3-iodobenzene (28.3 g) instead of the 1-bromo-4-iodobenzene (28.3 g) was used for the synthesis. (Yield: 99%) ($^1$H NMR (300 MHz, DMSO-$d_6$) δ(ppm): 7.77 (dd, $^3J_{HH}$=1.5 Hz, $^3J_{HH}$=1.5 Hz, 1H), 7.50-7.70 (m, 4H), 7.32-7.48 (m, 4H))

Synthesis Example 4: Synthesis of 5-[2-(3-Bromophenyl)ethynyl]pyrimidine

5-[2-(3-Bromophenyl)ethynyl]pyrimidine was obtained according to the same method as Synthesis Example 1 except that 1-bromo-3-iodobenzene (28.3 g) instead of 1-bromo-4-iodobenzene (28.3 g) and 5-ethynylpyrimidine (12.5 g) instead of the phenylacetylene (12.3 g) were used for the synthesis, and a hexane/ethyl acetate mixed solvent instead of the hexane was used as an eluant to purify a mixture. (Yield: 95%)

Synthesis Example 5: Synthesis of 5-[2-(3-Bromophenyl)ethynyl]-1H-indole

5-[2-(3-Bromophenyl)ethynyl]-1H-indole was obtained according to the same method as Synthesis Example 1 except that 1-bromo-3-iodobenzene (28.3 g) instead of the 1-bromo-4-iodobenzene (28.3 g) and 5-ethynyl-1H-indole (16.9 g) instead of the phenylacetylene (12.3 g) were used for the synthesis, and a hexane/ethyl acetate mixed solvent instead of the hexane was used to as an eluant purify a mixture. (Yield: 92%)

Synthesis Example 6: Synthesis of 4-Bromobenzyl

After putting a stirrer bar in a 1 L round-bottomed flask dried in a vacuum oven, 1-bromo-4-(2-phenylethynyl)benzene (25.7 g), iodide (12.7 g), and N,N'-dimethylsulfoxide (0.4 L) were put therein, and after connecting a condenser to the flask, and the obtained mixture was refluxed for 6 hours. Subsequently, the mixture was diluted with a sodium thiosulfate aqueous solution (1 M, 0.5 L) and then, with 1 L of ethyl acetate again. After the dilution, the resultant was extracted with distilled water (three times by 1 L at each time), and an organic layer therefrom was dried with sodium sulfate anhydride. Then, the mixture was filtered and concentrated to obtain 4-bromobenzyl at an equivalent yield. ($^1$H NMR (300 MHz, DMSO-$d_6$) δ(ppm): 7.94 (d, $^3J_{HH}$=7.2 Hz, 2H), 7.86 (s, 4H), 7.81 (dd, $^3J_{HH}$=7.5 Hz, $^3J_{HH}$=7.2 Hz, 1H), 7.63 (dd, $^3J_{HH}$=7.5 Hz, $^3J_{HH}$=7.5 Hz, 2H))

Synthesis Example 7: Synthesis of 1-(4-Bromophenyl)-2-(4-hydroxyphenyl)-1,2-ethanedione 1-(4-Bromophenyl)-2-(4-hydroxyphenyl)-1,2-ethanedione was obtained as an equivalent yield according to the same method as Synthesis Example 6 except that 4-[2-(4-bromophenyl)ethynyl]phenol (27.3 g) instead of the 1-bromo-4-(2-phenylethynyl)benzene (25.7 g) was used for the synthesis.

Synthesis Example 8: Synthesis of 3-Bromobenzyl

3-Bromobenzyl was obtained according to the same method as Synthesis Example 6 except that 1-bromo-3-(2-phenylethynyl)benzene (25.7 g) instead of the 1-bromo-4-(2-phenylethynyl)benzene (25.7 g) was used for the synthesis. (Yield: 84%) NMR (300 MHz, DMSO-$d_6$) δ (ppm): 8.09 (dd, $^3J_{HH}$=1.8 Hz, $^3J_{HH}$=1.5 Hz, 1H), 8.01 (ddd, $^3J_{HH}$=7.8 Hz, $^3J_{HH}$=1.8 Hz, $^3J_{HH}$=0.9 Hz, 1H), 7.96 (m, 2H), 7.92 (ddd, $^3J_{HH}$=7.8 Hz, $^3J_{HH}$=0.9 Hz, =0.9 Hz, 1H), 7.82 (m, 1H), 7.55-7.70 (m, 3H))

Synthesis Example 9: Synthesis of 1-(5-Pyrimidinyl)-2-(3-bromophenyl)-1,2-ethanedione 1-(5-Pyrimidinyl)-2-(3-bromophenyl)-1,2-ethanedione was obtained according to the same method as Synthesis Example 6 except that 5-[2-(3-bromophenyl)ethynyl]pyrimidine (25.9 g) instead of the 1-bromo-4-(2-phenylethynyl)benzene (25.7 g) was used for the synthesis. (Yield: 78%)

Synthesis Example 10: Synthesis of 1-(5-1H-indolo)-2-(3-bromophenyl)-1,2-ethanedione 1-(5-1H-indolo)-2-(3-bromophenyl)-1,2-ethanedione was obtained according to the same method as Synthesis Example 6 except that 5-[2-(3-bromophenyl)ethynyl]-1H-indole (29.6 g) was used instead of the 1-bromo-4-(2-phenylethynyl)benzene (25.7 g). (Yield: 75%)

Synthesis Example 11: Synthesis of 3-(3-Bromophenyl)-2,4,5-triphenyl-2,4-cyclopentadien-1-one After putting a stirrer bar in a 1 L 2-necked round-bottomed flask dried in a vacuum oven, the 3-bromobenzyl (28.9 g) according to Synthesis Example 8, 1,3-diphenyl-2-propanone (25.2 g), and anhydrous ethanol (300 mL) were put therein and then, stirred for 1 hour, while refluxing. Subsequently, a solution prepared by dissolving potassium hydroxide (1.4 g) in anhydrous ethanol (7 mL) was slowly added thereto in a dropwise fashion by using a syringe, and then, the obtained mixture was stirred for 45 minutes, while refluxing. Then, the mixture was diluted with 1 L of ethyl acetate and washed with distilled water (three times by 1 L at each time). Subsequently, an organic layer therefrom was dried with magnesium sulfate anhydride and then, filtered and concentrated. The concentrated mixture was purified through silica gel column chromatography using 10% ethyl acetate/hexane as an eluant to obtain 3-(3-bromophenyl)-2,4,5-triphenyl-2,4-cyclopentadien-1-one. (Yield: 70%) ($^1$H NMR (300 MHz, DMSO-$d_6$) δ(ppm): 7.47 (d, $^3J_{HH}$=8.1 Hz, 1H), 7.10-7.38 (m, 15H), 6.95-7.05 (m, 3H))

Synthesis Example 12: Synthesis of 3-(4-Bromophenyl)-2,4,5-triphenyl-2,4-cyclopentadien-1-one 3-(4-Bromophenyl)-2,4,5-triphenyl-2,4-cyclopentadien-1-one was obtained according to the same method as Synthesis Example 11 except that the 4-bromobenzyl (28.9 g) of Synthesis Example 6 was used instead of the 3-bromobenzyl (28.9 g) of Synthesis Example 8. (Yield: 75%) NMR (300 MHz, DMSO-$d_6$) δ(ppm): 7.47 (d, $^3J_{HH}$=8.4 Hz, 2H), 7.10-7.38 (m, 15H), 6.93 (d, $^3J_{HH}$=8.4 Hz, 2H))

Synthesis Example 13: Synthesis of 3-(4-Bromophenyl)-4-(4-hydroxyphenyl)-2,5-diphenyl-2,4-cyclopentadien-1-one 3-(4-Bromophenyl)-4-(4-hydroxyphenyl)-2,5-diphenyl-2,4-cyclopentadien-1-one was obtained according to the same method as except that the 1-(4-bromophenyl)-2-(4-hydroxyphenyl)-1,2-ethanedione (30.5 g) of Synthesis Example 7 was used instead of the 3-bromobenzyl (28.9 g) of Synthesis Example 8 for the synthesis. (Yield: 72%)

Synthesis Example 14: Synthesis of 3-(3-Bromophenyl)-2,5-di(4-hydroxyphenyl)-4-phenyl-2,4-cyclopentadien-1-one 3-(3-Bromophenyl)-2,5-di(4-hydroxyphenyl)-4-phenyl-2,4-cyclopentadien-1-one was obtained according to the same method as Synthesis Example 11 except that 1,3-di(4-hydroxyphenyl)-2-propanone (29.0 g) was used instead of the 1,3-diphenyl-2-propanone (25.2 g) for the synthesis. (Yield: 65%)

Synthesis Example 15: Synthesis of 3-(3-Bromophenyl)-2,5-di(4-hydroxyphenyl)-4-(5-pyrimidinyl)-2,4-cyclopentadien-1-one 3-(3-Bromophenyl)-2,5-di(4-hydroxyphenyl)-4-(5-pyrimidinyl)-2,4-cyclopentadien-1-one was obtained according to the same method as Synthesis Example 11 except that the 1-(5-pyrimidinyl)-2-(3-bromophenyl)-1,2-ethanedione (29.1 g) of Synthesis Example 9 instead of the 3-bromobenzyl (28.9 g) of Synthesis Example 8 and 1,3-di(4-hydroxyphenyl)-2-propanone (29.0 g) instead of the 1,3-diphenyl-2-propanone (25.2 g) were used for the synthesis. (Yield: 67%)

Synthesis Example 16: Synthesis of 3-(3-Bromophenyl)-2,5-di(4-hydroxyphenyl)-4-(5-1H-indolo)-2,4-cyclopentadien-1-one 3-(3-Bromophenyl)-2,5-di(4-hydroxyphenyl)-4-(5-1H-indolo)-2,4-cyclopentadien-1-one was obtained according to the same method as Synthesis Example 11 except that the 1-(5-1H-indolo)-2-(3-bromophenyl)-1,2-ethanedione (32.8 g) of Synthesis Example 10 instead of the 3-bromobenzyl (28.9 g) of Synthesis Example 8 and 1,3-di(4-hydroxyphenyl)-2-propanone (29.0 g) instead of the 1,3-diphenyl-2-propanone (25.2 g) was used for the synthesis. (Yield: 60%)

Synthesis Example 17: Synthesis of 3,4-Di(4-bromophenyl)-2,5-diphenyl-2,4-cyclopentadien-1-one 3,4-Di(4-bromophenyl)-2,5-diphenyl-2,4-cyclopentadien-1-one was obtained according to the same method as Synthesis Example 11 except that the 4,4'-dibromobenzyl (36.8 g) was used instead of the 3-bromobenzyl (28.9 g) of Synthesis Example 8 for the synthesis. (Yield: 74%) ($^1$H NMR (300 MHz, DMSO-$d_6$) δ (ppm): 7.48 (d, $^3J_{HH}$=8.4 Hz, 4H), 7.10-7.38 (m, 10H), 6.94 (d, $^3J_{HH}$=8.4 Hz, 4H))

Synthesis Example 18: Synthesis of 3,4-Di(4-bromophenyl)-2,5-di(4-hydroxyphenyl)-2,4-cyclopentadien-1-one 3,4-Di(4-bromophenyl)-2,5-di(4-hydroxyphenyl)-2,4-cyclopentadien-1-one was obtained according to the same method as Synthesis Example 11 except that 4,4'-dibromobenzyl (36.8 g) instead of the 3-bromobenzyl (28.9 g) of Synthesis Example 8 and 1,3-di(4-hydroxyphenyl)-2-propanone (29.0 g) instead of the 1,3-diphenyl-2-propanone (25.2 g) were used for the synthesis. (Yield: 69%)

Synthesis Example 19: Synthesis of 3-(3-Ethynylphenyl)-2,4,5-triphenyl-2,4-cyclopentadien-1-one After putting a stirring bar in a 1 L 2-necked round-bottomed flask dried in a vacuum oven, the 3-(3-bromophenyl)-2,4,5-triphenyl-2,4-cyclopentadien-1-one (46.3 g) of Synthesis Example 11, bis(triphenylphosphine)palladium(II)dichloride (1.4 g), copper iodide (I) (0.38 g), and 0.5 L of a triethylamine/tetrahydrofuran mixed solvent (volume ratio of 1:1) were put therein and bubbled with nitrogen gas for 30 minutes. Subsequently, (trimethylsilyl)acetylene (29.5 g) was added thereto, and the obtained mixture was stirred under a nitrogen atmosphere for 24 hours, while refluxing. Then, the mixture was filtered through a paper filter and concentrated in a 1 L round-bottomed flask, and potassium carbonate (41.5 g) was added thereto and then, diluted with 0.5 L of a methanol/tetrahydrofuran mixed solvent (volume ratio of 1:1). After putting a stirring bar in the diluted solution for 30 minutes and fervently stirring the solution, the stirred solution was filtered with a paper filter and then, concentrated in a 1 L round-bottomed flask. Subsequently, the mixture was diluted with 1 L of ethyl acetate and then, washed with distilled water (three times by 1 L at each time). An organic layer therefrom was dried with magnesium sulfate anhydride and then, filtered and concentrated. The concentrated mixture was purified through silica gel column chromatography using 10% ethyl acetate/hexane as an eluant to obtain 3-(3-ethynylphenyl)-2,4,5-triphenyl-2,4-cyclopentadien-1-one. (Yield: 60%)

Synthesis Example 20: Synthesis of 2,3,5-Triphenyl-4-[4-(2-phenylethynyl)phenyl]-2,4-cyclopentadien-1-one After putting a stirring bar in a 1 L 2-necked round-bottomed flask dried in a vacuum oven, the 3-(4-bromophenyl)-2,4,5-triphenyl-2,4-cyclopentadien-1-one (46.3 g) of Synthesis Example 12, bis(triphenylphosphine)palladium(II)dichloride (1.4 g), copper iodide (I) (0.38 g), and 0.5 L of a triethylamine/tetrahydrofuran mixed solution (volume ratio of 1:1) were put therein and bubbled with nitrogen gas for 30 minutes. Subsequently, phenylacetylene (12.2 g) was added thereto, and the obtained mixture was stirred under a nitrogen atmosphere for 24 hours, while refluxing. Then, the obtained mixture was filtered with a paper filter, concentrated, diluted with 1 L of ethyl acetate, and washed with distilled water (three times by 1 L at each time). An organic layer therefrom was dried with magnesium sulfate anhydride and then, filtered and concentrated. The concentrated mixture was purified through silica gel column chromatography using 10% ethyl acetate/hexane as an eluant to obtain 2,3,5-triphenyl-4-[4-(2-phenylethynyl)phenyl]-2,4-cyclopentadien-1-one. (Yield: 93%) ($^1$H NMR (300 MHz, DMSO-$d_6$) δ (ppm): 7.49-7.57 (m, 2H), 7.37-7.46 (m, 5H), 7.22-7.34 (m, 9H), 7.14-7.22 (m, 4H), 7.00 (d, $^3J_{HH}$=8.0 Hz, 4H))

Synthesis Example 21: Synthesis of 2,5-Diphenyl-3,4-di[4-(2-phenylethynyl)phenyl]-2,4-cyclopentadien-1-one After putting a stirring bar in a 1 L 2-necked round-bottomed flask dried in a vacuum oven, the 3,4-di(4-bromophenyl)-2,5-diphenyl-2,4-cyclopentadien-1-one (54.2 g) of Synthesis Example 17, bis(triphenylphosphine)palladium(II)dichloride (2.8 g), copper iodide (I) (0.76 g) and 0.5 L of a triethylamine/tetrahydrofuran mixed solvent (volume ratio of 1:1) were put therein and bubbled with nitrogen gas for 30 minutes. Subsequently, phenylacetylene (24.4 g) was added thereto, and the obtained mixture was stirred under a nitrogen atmosphere for 48 hours, while refluxing. Then, the obtained mixture was filtered with a paper filter, concentrated, diluted with 1 L of ethyl acetate, and washed with distilled water (three times by 1 L at each time). An organic layer therefrom was dried with magnesium sulfate anhydride and then, filtered and concentrated. The concentrated mixture was purified through silica gel column chromatography using 10% ethyl acetate/hexane as an eluant to obtain 2,5-diphenyl-3,4-di[4-(2-phenylethynyl)phenyl]-2,4-cyclopentadien-1-one. (Yield: 85%)

Synthesis Example 22: Synthesis of 2,5-Di(4-hydroxyphenyl)-3-phenyl-4-(3-ethynylphenyl)-2,4-cyclopentadien-1-one 2,5-Di(4-hydroxyphenyl)-3-phenyl-4-(3-ethynylphenyl)-2,4-cyclopentadien-1-one was obtained according to the same method as Synthesis Example 19 except that the 3-(3-bromophenyl)-2,5-di(4-hydroxyphenyl)-4-phenyl-2,4-cyclopentadien-1-one (49.5 g) of Synthesis Example 14 was used instead of the 3-(3-bromophenyl)-2,4,5-triphenyl-2,4-cyclopentadien-1-one (46.3 g) of Synthesis Example 11. (Yield: 55%)

Synthesis Example 23: Synthesis of 2,5-Di(4-hydroxyphenyl)-3-(5-pyrimidinyl)-4-(3-ethynylphenyl)-2,4-cyclopentadien-1-one 2,5-Di(4-hydroxyphenyl)-3-(5-pyrimidinyl)-4-(3-ethynylphenyl)-2,4-cyclopentadien-1-one was obtained according to the same method as Synthesis Example 19 except that the 3-(3-bromophenyl)-2,5-di(4-hydroxyphenyl)-4-(5-pyrimidinyl)-2,4-cyclopentadien-1-one (49.7 g) of Synthesis Example 15 was used instead of the 3-(3-bromophenyl)-2,4,5-triphenyl-2,4-cyclopentadien-1-one (46.3 g) of Synthesis Example 11. (Yield: 48%)

Synthesis Example 24: Synthesis of 2,5-Di(4-hydroxyphenyl)-3-(5-1H-indolo)-4-(3-ethynylphenyl)-2,4-cyclopentadien-1-one 2,5-Di(4-hydroxyphenyl)-3-(5-1H-indolo)-4-(3-ethynylphenyl)-2,4-cyclopentadien-1-one was obtained according to the same method as Synthesis Example 19 except that the 3-(3-bromophenyl)-2,5-di(4-hydroxyphenyl)-4-(5-1H-indolo)-2,4-cyclopentadien-1-one (53.4 g) of Synthesis Example 16 was used instead of the 3-(3-bromophenyl)-2,4,5-triphenyl-2,4-cyclopentadien-1-one (46.3 g) of Synthesis Example 11. (Yield: 59%)

Synthesis Example 25: Synthesis of 2,3,5-Triphenyl-4-{4-[2-(4-hydroxyphenyl)ethynyl]phenyl}-2,4-cyclopentadien-1-one 2,3,5-Triphenyl-4-{4-[2-(4-hydroxyphenyl)ethynyl]phenyl}-2,4-cyclopentadien-1-one was obtained according to the same method as Synthesis Example 20 except that 4-ethynylphenol (14.2 g) was used instead of the phenylacetylene (12.2 g). (Yield: 90%) ($^1$H NMR (300 MHz, DMSO-do) δ (ppm): 9.95 (s, 1H), 7.1-7.6 (m, 18H), 6.85-7.04 (m, 3H), 6.70-6.85 (m, 2H)

Synthesis Example 26: 2,5-Diphenyl-3-{4-[2-(5-pyrimidinyl)ethynyl]phenyl}-4-(4-hydroxyphenyl)-2,4-cyclopentadien-1-one 2,5-Diphenyl-3-{4-[2-(5-pyrimidinyl)ethynyl]phenyl}-4-(4-hydroxyphenyl)-2,4-cyclopentadien-1-one was obtained according to the same method as Synthesis Example 20 except that 5-ethynylpyrimidine (12.5 g) instead of the phenylacetylene (12.5 g) and the 3-(4-bromophenyl)-4-(4-hydroxyphenyl)-2,5-diphenyl-2,4-cyclopentadien-1-one (47.9 g) of Synthesis Example 13 instead of the 3-(4-bromophenyl)-2,4,5-triphenyl-2,4-cyclopentadien-1-one (46.3 g) of Synthesis Example 12 were used. (Yield: 88%)

Synthesis Example 27: Synthesis of 2,5-Diphenyl-3-{4-[2-(5-1H-indolo)ethynyl]phenyl}-4-(4-hydroxyphenyl)-2,4-cyclopentadien-1-one 2,5-Diphenyl-3-{4-[2-(5-1H-indolo)ethynyl]phenyl}-4-(4-hydroxyphenyl)-2,4-cyclopentadien-1-one was obtained according to the same method as Synthesis Example 20 except that 5-ethynyl-1H-indole (16.9 g) instead of the phenylacetylene (12.5 g) and the 3-(4-bromophenyl)-4-(4-hydroxyphenyl)-2,5-diphenyl-2,4-cyclopentadien-1-one (47.9 g) of Synthesis Example 13 instead of the 3-(4-bromophenyl)-2,4,5-triphenyl-2,4-cyclopentadien-1-one (46.3 g) of Synthesis Example 12 were used. (Yield: 82%)

Synthesis Example 28: Synthesis of 2,5-Di(4-hydroxyphenyl)-3,4-di[4-(2-phenylethynyl)phenyl]-2,4-cyclopentadien-1-one 2,5-Di(4-hydroxyphenyl)-3,4-di[4-(2-phenylethynyl)phenyl]-2,4-cyclopentadien-1-one was obtained according to the same method as Synthesis Example 21 except that the 3,4-di(4-bromophenyl)-2,5-di(4-hydroxyphenyl)-2,4-cyclopentadien-1-one (57.5 g) of Synthesis Example 18 instead of the 3,4-di(4-bromophenyl)-2,5-diphenyl-2,4-cyclopentadien-1-one (54.2 g) of Synthesis Example 17 was used. (Yield: 78%)

Synthesis of Polymer

Synthesis Example 29

A polymer represented by Chemical Formula e1 was synthesized by putting tetraphenyl cyclopentadienone (3.84 g), the 2,5-di(4-hydroxyphenyl)-3-phenyl-4-(3-ethynylphenyl)-2,4-cyclopentadien-1-one (17.6 g) of Synthesis Example 22, 4-ethynylphenol (1.18 g), and 1-methyl-2-pyrrolidone (33.9 g) in a 100 mL one-necked round-bottomed flask and stirring the mixture for 12 hours, while refluxing. (Mw: 2,125)

[Chemical Formula e1]

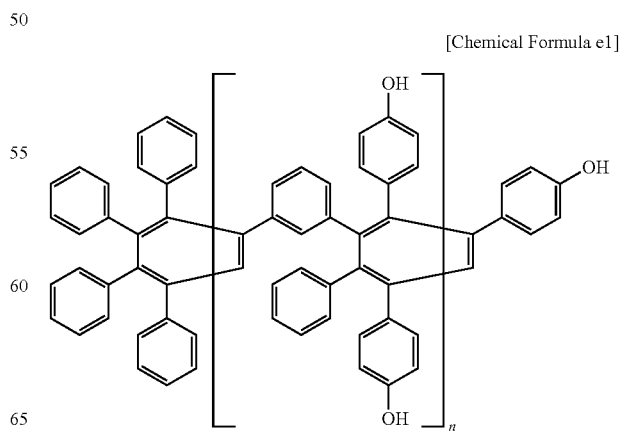

Synthesis Example 30

A polymer represented by Chemical Formula e2 was synthesized by putting tetraphenylcyclopentadienone (3.84 g), 2,5-di(4-hydroxyphenyl)-3-(5-pyrimidinyl)-4-(3-ethynylphenyl)-2,4-cyclopentadien-1-one (17.7 g) of Synthesis Example 23, 4-ethynylphenol (1.18 g), and 1-methyl-2-pyrrolidone (34.1 g) in a 100 mL one-necked round-bottomed flask and stirring the mixture for 12 hours, while refluxing. (Mw: 2,132)

[Chemical Formula e2]

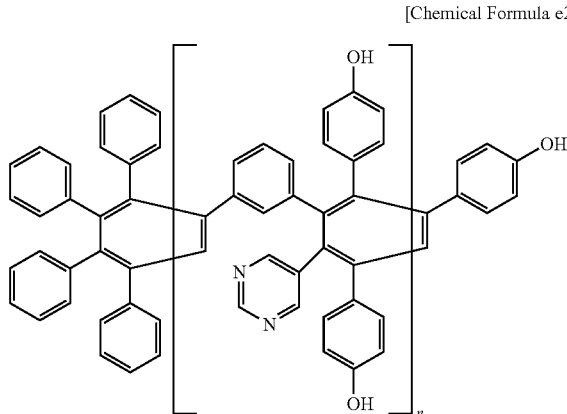

Synthesis Example 31

A polymer represented by Chemical Formula e3 was synthesized by putting tetraphenylcyclopentadienone (3.84 g), the 2,5-di(4-hydroxyphenyl)-3-(5-1H-indolo)-4-(3-ethynylphenyl)-2,4-cyclopentadien-1-one (19.2 g) of Synthesis Example 24, 4-ethynylphenol (1.18 g), and 1-methyl-2-pyrrolidone (36.3 g) in a 100 mL one-necked round-bottomed flask and stirring the mixture for 12 hours while refluxing. (Mw: 2,281)

[Chemical Formula e3]

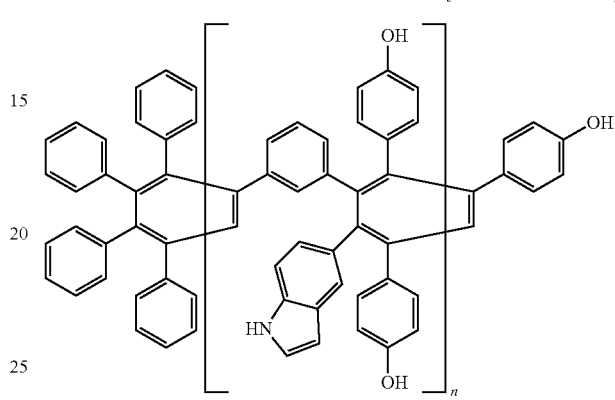

Synthesis Example 32

A polymer represented by Chemical Formula e4 was synthesized by putting tetraphenylcyclopentadienone (3.84 g), the 2,3,5-triphenyl-4-{4-[2-(4-hydroxyphenyl)ethynyl]phenyl}-2,4-cyclopentadien-1-one (20.0 g) of Synthesis Example 25, 4-(2-phenylethynyl)phenol (1.94 g), and 1-methyl-2-pyrrolidone (38.7 g) in a 100 mL one-necked round-bottomed flask and stirring the mixture for 20 hours, while refluxing. (Mw: 2,441)

[Chemical Formula e4]

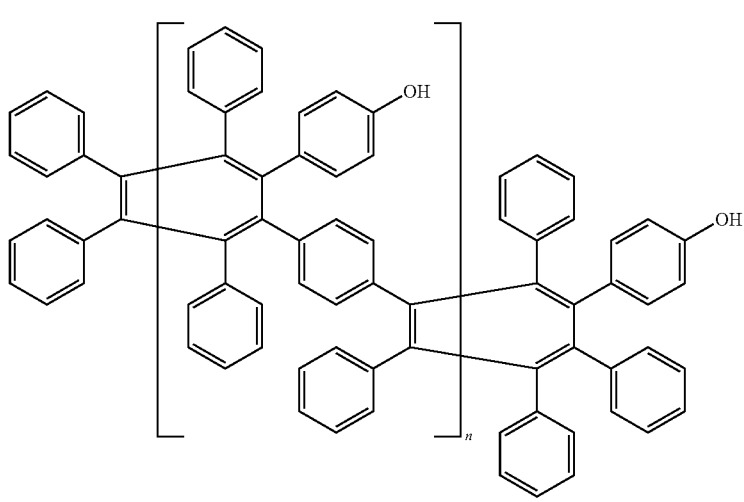

Synthesis Example 33

A polymer represented by Chemical Formula e5 was synthesized by putting tetraphenylcyclopentadienone (3.84 g), the 2,5-diphenyl-3-{4-[2-(5-pyrimidinyl)ethynyl]phenyl}-4-(4-hydroxyphenyl)-2,4-cyclopentadien-1-one (20.1 g) of Synthesis Example 26, 4-(2-phenylethynyl)phenol (1.94 g), and 1-methyl-2-pyrrolidone (38.8 g) in a 100 mL one-necked round-bottomed flask and stirring the mixture for 20 hours, while refluxing. (Mw: 2,449)

[Chemical Formula e5]

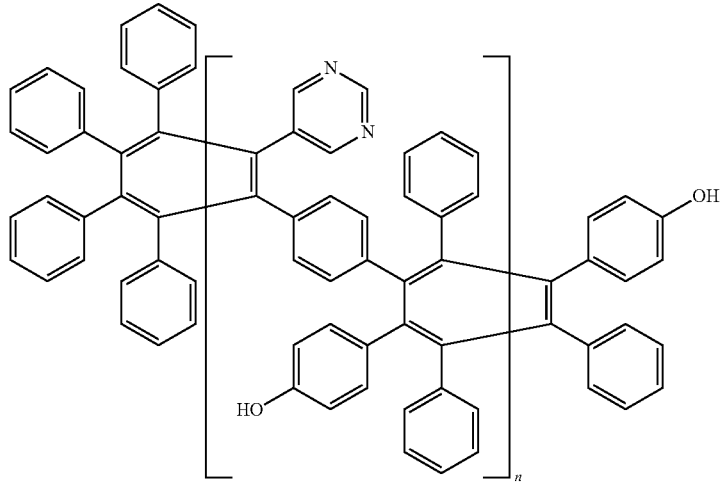

Synthesis Example 34

A polymer represented by Chemical Formula e6 was synthesized by putting tetraphenylcyclopentadienone (3.84 g), the 2,5-diphenyl-3-{4-[2-(5-1H-indolo)ethynyl]phenyl}-4-(4-hydroxyphenyl)-2,4-cyclopentadien-1-one (21.6 g) of Synthesis Example 27, 4-(2-phenylethynyl)phenol (1.94 g), and 1-methyl-2-pyrrolidone (41.1 g) in a 100 mL one-necked round-bottomed flask and stirring the mixture for 20 hours while refluxing. (Mw: 2,597)

[Chemical Formula e6]

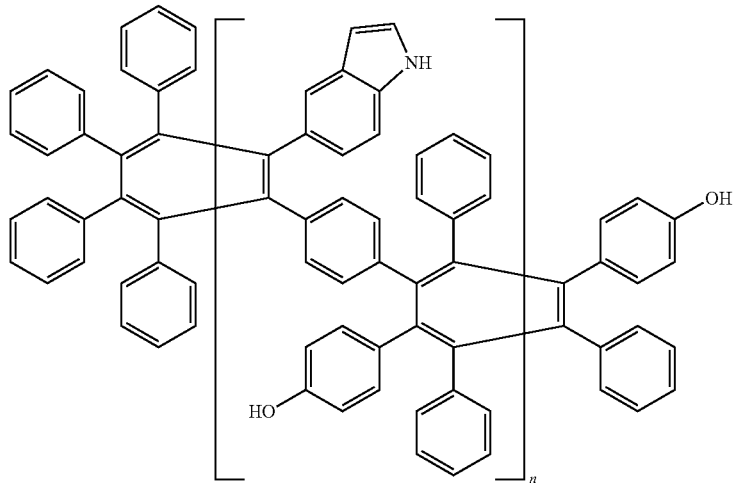

Synthesis Example 35

A polymer represented by Chemical Formula e7 was synthesized by putting tetraphenylcyclopentadienone (3.84 g), the 2,5-di(4-hydroxyphenyl)-3,4-di[4-(2-phenylethynyl)phenyl]-2,4-cyclopentadien-1-one (18.5 g) of Synthesis Example 28, 4-(2-phenylethynyl)phenol (1.94 g), and 1-methyl-2-pyrrolidone (36.4 g) in a 100 mL one-necked round-bottomed flask and stirring the mixture for 20 hours while refluxing. (Mw: 2,317)

[Chemical Formula e7]

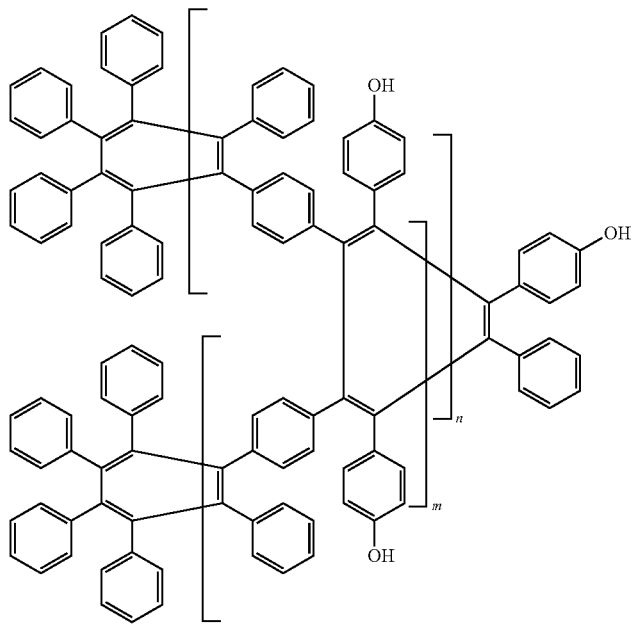

Reference Synthesis Example 1

A polymer represented by Chemical Formula e8 was synthesized by putting tetraphenylcyclopentadienone (3.84 g), the 3-(3-ethynylphenyl)-2,4,5-triphenyl-2,4-cyclopentadien-1-one (16.3 g) of Synthesis Example 19, phenylacetylene (1.02 g), and 1-methyl-2-pyrrolidone (31.7 g) in a 100 mL one-necked round-bottomed flask and stirring the mixture for 12 hours, while refluxing. (Mw: 1,980)

[Chemical Formula e8]

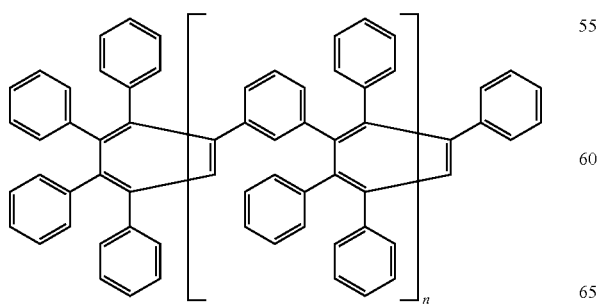

Reference Synthesis Example 2

A polymer represented by Chemical Formula e9 was synthesized by putting tetraphenylcyclopentadienone (3.84 g), the 2,3,5-triphenyl-4-[4-(2-phenylethynyl)phenyl]-2,4-cyclopentadien-1-one (19.4 g) of Synthesis Example 20, diphenylacetylene (1.78 g), and 1-methyl-2-pyrrolidone (37.5 g) in a 100 mL one-necked round-bottomed flask and stirring the mixture for 20 hours, while refluxing. (Mw: 2,361)

[Chemical Formula e9]

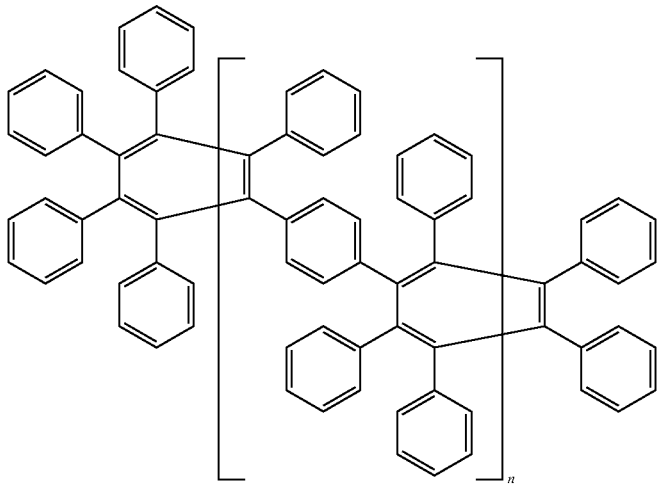

Reference Synthesis Example 3

A polymer represented by Chemical Formula e10 was synthesized by putting tetraphenylcyclopentadienone (3.84 g), the 2,5-diphenyl-3,4-di[4-(2-phenylethynyl)phenyl]-2,4-cyclopentadien-1-one (17.5 g) of Synthesis Example 21, diphenylacetylene (1.78 g), and 1-methyl-2-pyrrolidone (34.7 g) in a 100 mL one-necked round-bottomed flask and stirring the mixture for 20 hours, while refluxing. (Mw: 2,205)

[Chemical Formula e10]

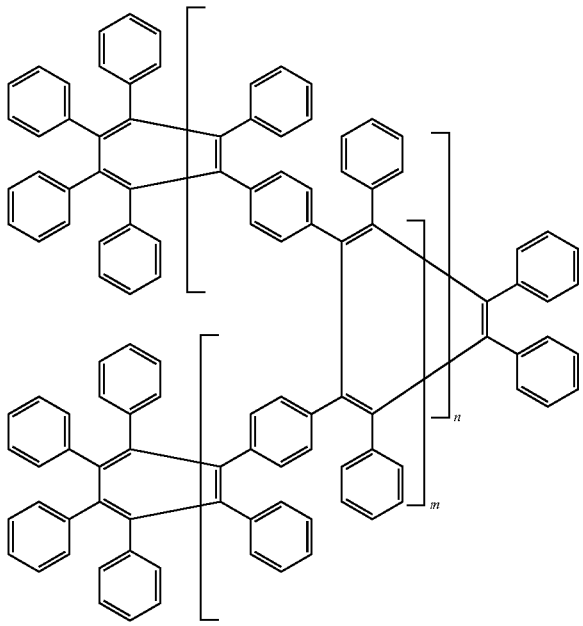

Formation of Organic Layer

Example 1

The polymer according to Synthesis Example 29 was dissolved in 56.6 g of 1-methoxy-2-propylacetate to prepare a hardmask composition, and the hardmask composition was spin-coated on a silicon wafer and heat-treated at 500° C. for 2 minutes under a nitrogen atmosphere to form a 4,000 Å-thick organic layer.

Example 2

The polymer according to Synthesis Example 30 was dissolved in 56.8 g of 1-methoxy-2-propylacetate to prepare a hardmask composition, and the hardmask composition was spin-coated on a silicon wafer and heat-treated at 500° C. for 2 minutes under a nitrogen atmosphere to form a 4,000 Å-thick organic layer.

Example 3

The polymer according to Synthesis Example 31 was dissolved in 60.6 g of 1-methoxy-2-propylacetate to prepare a hardmask composition, and the hardmask composition was spin-coated on a silicon wafer and heat-treated at 500° C. for 2 minutes under a nitrogen atmosphere to form a 4,000 Å-thick organic layer.

Example 4

The polymer according to Synthesis Example 32 was dissolved in 64.5 g of 1-methoxy-2-propylacetate to prepare a hardmask composition, and the hardmask composition was spin-coated on a silicon wafer and heat-treated at 500° C. for 2 minutes under a nitrogen atmosphere to form a 4,000 Å-thick organic layer.

Example 5

The polymer according to Synthesis Example 33 was dissolved in 64.7 g of 1-methoxy-2-propylacetate to prepare a hardmask composition, and the hardmask composition was spin-coated on a silicon wafer and heat-treated at 500° C. for 2 minutes under a nitrogen atmosphere to form a 4,000 Å-thick organic layer.

Example 6

The polymer according to Synthesis Example 34 was dissolved in 68.5 g of 1-methoxy-2-propylacetate to prepare a hardmask composition, and the hardmask composition was spin-coated on a silicon wafer and heat-treated at 500° C. for 2 minutes under a nitrogen atmosphere to form a 4,000 Å-thick organic layer.

Example 7

The polymer according to Synthesis Example 35 was dissolved in 60.7 g of 1-methoxy-2-propylacetate to prepare a hardmask composition, and the hardmask composition was spin-coated on a silicon wafer and heat-treated at 500° C. for 2 minutes under a nitrogen atmosphere to form a 4,000 Å-thick organic layer.

Reference Example 1

The polymer according to Reference Synthesis Example 1 was dissolved in 52.9 g of 1-methoxy-2-propylacetate to prepare a hardmask composition, and the hardmask composition was spin-coated on a silicon wafer and heat-treated at 500° C. for 2 minutes under a nitrogen atmosphere to form a 4,000 Å-thick organic layer.

Reference Example 2

The polymer according to Reference Synthesis Example 2 was dissolved in 62.6 g of 1-methoxy-2-propylacetate to prepare a hardmask composition, and the hardmask composition was spin-coated on a silicon wafer and heat-treated at 500° C. for 2 minutes under a nitrogen atmosphere to form a 4,000 Å-thick organic layer.

Reference Example 3

The polymer according to Reference Synthesis Example 3 was dissolved in 57.8 g of 1-methoxy-2-propylacetate to prepare a hardmask composition, and the hardmask composition was spin-coated on a silicon wafer and heat-treated at 500° C. for 2 minutes under a nitrogen atmosphere to form a 4,000 Å-thick organic layer.

Evaluation 1: Etch Resistance Evaluation

Thicknesses of each of the organic layers according to Examples 1 to 7 and Reference Examples 1 to 3 were measured. Subsequently, the organic layers were dry-etched by using a $CF_x$ mixed gas for 100 seconds, and thicknesses thereof after the dry etching were measured again.

A thickness difference of the organic layers before and after the dry etching and etching time were used to calculate a bulk etch rate (BER) according to Calculation Equation 1.

Etch rate (Å/s)=(Initial thickness of organic layer—Thickness of organic layer after etching)/Etching time          [Calculation Equation 1]

The results are shown in Table 1.

TABLE 1

|  | $CF_x$ Bulk etch rate (Å/s) |
|---|---|
| Example 1 (Synthesis Example 29) | 18.6 |
| Example 2 (Synthesis Example 30) | 18.5 |
| Example 3 (Synthesis Example 31) | 18.6 |
| Example 4 (Synthesis Example 32) | 18.9 |
| Example 5 (Synthesis Example 33) | 18.8 |
| Example 6 (Synthesis Example 34) | 18.7 |
| Example 7 (Synthesis Example 35) | 19.9 |
| Reference Example 1 (Reference Synthesis Example 1) | 20.1 |
| Reference Example 2 (Reference Synthesis Example 2) | 20.0 |
| Reference Example 3 (Reference Synthesis Example 3) | 21.3 |

Referring to Table 1, the organic layers of Examples 1 to 7 exhibited sufficient etch resistance against etching gas and thus improved etch resistance, compared with those of Reference Examples 1 to 3.

Evaluation 2: Chemical Resistance Evaluation

Thicknesses of each of the organic layers according to Examples 1 to 7 and Reference Examples 1 to 3 were measured. Subsequently, after treating the organic layers with a KrF thinner for 1 minute, thicknesses of the residual organic layers were measured again. (KrF thinner: ethyl 3-ethoxypropionate (EEP)/ethyl lactate (EL)/gamma-butyrolactone (GBL)=75/20/5)

The results are shown in Table 2.

TABLE 2

|  | Chemical resistance against KrF thinner |
| --- | --- |
| Example 1 (Synthesis Example 29) | ○ |
| Example 2 (Synthesis Example 30) | ○ |
| Example 3 (Synthesis Example 31) | ○ |
| Example 4 (Synthesis Example 32) | ○ |
| Example 5 (Synthesis Example 33) | ○ |
| Example 6 (Synthesis Example 34) | ○ |
| Example 7 (Synthesis Example 35) | ○ |
| Reference Example 1 (Reference Synthesis Example 1) | X |
| Reference Example 2 (Reference Synthesis Example 2) | X |
| Reference Example 3 (Reference Synthesis Example 3) | X |

○: a thickness of a residual organic layer was greater than or equal to 80% of an initial thickness of an organic layer
X: a thickness of a residual organic layer was less than 80% of an initial thickness of an organic layer Referring to Table 2, the organic layers according to Examples 1 to 7 exhibited improved chemical resistance against a KrF thinner, compared with the organic layers according to Reference Examples 1 to 3.

By way of summation and review, some lithographic techniques may include providing a material layer on a semiconductor substrate; coating a photoresist layer thereon; exposing and developing the same to provide a photoresist pattern; and etching a material layer using the photoresist pattern as a mask.

According to small-sizing the pattern to be formed, it may be difficult to provide a fine pattern having an excellent profile by using some lithographic techniques. Accordingly, an auxiliary layer, called a hardmask layer, may be formed between the material layer and the photoresist layer to provide a fine pattern.

One or more embodiments may provide a hardmask composition, a hardmask layer including a cured product of the hardmask composition, and a method of forming patterns using the hardmask composition.

One or more embodiments may provide a hardmask composition capable of improving etch resistance and chemical resistance.

According to an embodiment, etch resistance and chemical resistance of the hardmask layer may be obtained simultaneously.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A hardmask composition, comprising:
a solvent; and
a polymer that includes a plurality of substituted biphenylene repeating units, wherein:
the substituted biphenylene repeating units are represented by Chemical Formula 1 or Chemical Formula 2, and at least one phenylene of the biphenylene of the substituted biphenylene repeating units is substituted with at least one of a hydroxy-substituted C6 to C30 aryl group, and a hydroxy-substituted C3 to C30 heteroaryl group,

[Chemical Formula 1]

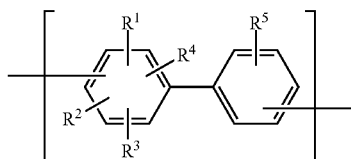

[Chemical Formula 2]

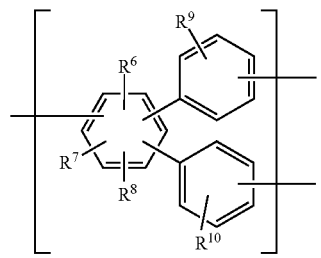

in Chemical Formula 1,
$R^1$ to $R^5$ are each independently hydrogen, deuterium, a halogen, a hydroxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 hetero alkyl group, a substituted or unsubstituted C3 to C30 cycloalkyl group, a substituted or unsubstituted C1 to C30 heterocycloalkyl group, a substituted or unsubstituted C1 to C30 arylalkyl group, a substituted or unsubstituted C6 to C30 heteroarylalkyl group, a substituted or unsubstituted C6 to C30 aryl group, a substituted or unsubstituted C3 to C30 heteroaryl group, or a combination thereof, and
at least one of $R^1$ to $R^5$ is a hydroxy-substituted C6 to C30 aryl group or a hydroxy-substituted C3 to C30 heteroaryl group,
in Chemical Formula 2,
$R^6$ to $R^{10}$ are each independently hydrogen, deuterium, a halogen, a hydroxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 hetero alkyl group, a substituted or unsubstituted C3 to C30 cycloalkyl group, a substituted or unsubstituted C1 to C30 heterocycloalkyl group, a substituted or unsubstituted C1 to C30 arylalkyl group, a substituted or unsubstituted C6 to C30 heteroarylalkyl group, a substituted or unsubstituted C6 to C30 aryl group, a substituted or unsubstituted C3 to C30 heteroaryl group, or a combination thereof, and
at least one of $R^6$ to $R^{10}$ is a hydroxy-substituted C6 to C30 aryl group or a hydroxy-substituted C3 to C30 heteroaryl group.

2. The hardmask composition as claimed in claim 1, wherein the one phenylene is substituted with at least one of a hydroxyphenyl group, a hydroxynaphthyl group, a hydroxybiphenyl group, a hydroxydiphenylfluorenyl group, a hydroxydinaphthylfluorenyl group, a hydroxyanthracenyl group, a hydroxyfluoranthenyl group, a hydroxyacenaphthylenyl group, a hydroxyacenaphthenyl group, a hydroxyphenanthrenyl group, a hydroxybenzophenanthrenyl group, a hydroxypyrenyl group, a hydroxytriphenylenyl group, a hydroxychrysenyl group, a hydroxytetracenyl group, a hydroxybenzofluoranthenyl group, a hydroxyperlenyl group, a hydroxybenzopyrenyl group, a hydroxynaphthoanthracenyl group, a hydroxypentacenyl group, a hydroxybenzoperlenyl group, a hydroxydibenzopyrenyl group, a hydroxycoronenyl group, a hydroxypyridinyl group, a hydroxypyrimidinyl group, a hydroxy triazinyl group, a hydroxypyrrolyl group, a hydroxy imidazolyl group, a hydroxypyrazolyl group, a hydroxyindolo group, a hydroxyisoindolo group, a hydroxybenzimidazolyl group, a hydroxy indazolyl group, a hydroxyfuranyl group, a hydroxybenzofuranyl group, a hydroxythiophenyl group, a hydroxyoxazolyl group, a hydroxythiazolyl group, a dihydroxyphenyl group, a dihydroxynaphthyl group, a dihydroxybiphenyl group, a dihydroxydiphenylfluorenyl group, a dihydroxydinaphthylfluorenyl group, a dihydroxyanthracenyl group, a dihydroxyfluoranthenyl group, a dihydroxyacenaphthylenyl group, a dihydroxyacenaphthenyl group, a dihydroxyphenanthrenyl group, a dihydroxybenzophenanthrenyl group, a dihydroxypyrenyl group, a dihydroxytriphenylenyl group, a dihydroxychrysenyl group, a dihydroxytetracenyl group, a dihydroxybenzofluoranthenyl group, a dihydroxyperlenyl group, a dihydroxybenzopyrenyl group, a dihydroxynaphthoanthracenyl group, a dihydroxypentacenyl group, a dihydroxybenzoperlenyl group, a dihydroxydibenzopyrenyl group, a dihydroxycoronenyl group, a dihydroxypyridinyl group, a dihydroxypyrimidinyl group, a dihydroxytriazinyl group, a dihydroxypyrrolyl group, a dihydroxyimidazolyl group, a dihydroxypyrazolyl group, a dihydroxyindolo group, a dihydroxyisoindolo group, a dihydroxybenzimidazolyl group, a dihydroxyindazolyl group, a dihydroxyfuranyl group, a dihydroxybenzofuranyl group, a dihydroxythiophenyl group, a dihydroxyoxazolyl group, and dihydroxythiazolyl group.

3. The hardmask composition as claimed in claim 1, wherein:
the one phenylene further includes at least one of a substituted or unsubstituted C6 to C30 aryl group and a substituted or unsubstituted C3 to C30 heteroaryl group, and
a substituent of the substituted C6 to C30 aryl group and the substituted C3 to C30 heteroaryl group is deuterium, a halogen, a nitro group, a cyano group, an amino group, a C1 to C30 alkyl group, a C2 to C30 alkenyl group, a C2 to C30 alkynyl group, a C6 to C30 aryl group, a C7 to C30 arylalkyl group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C30 heteroaryl group, or a combination thereof.

4. The hardmask composition as claimed in claim 1, wherein at least one of $R^1$ to $R^4$ is a hydroxy-substituted C6 to C30 aryl group or a hydroxy-substituted C3 to C30 heteroaryl group.

5. The hardmask composition as claimed in claim 4, wherein one or two of $R^1$ to $R^4$ are a hydroxy-substituted C6 to C30 aryl group or a hydroxy-substituted C3 to C30 heteroaryl group.

6. The hardmask composition as claimed in claim 1, wherein the substituted biphenylene repeating units represented by Chemical Formula 1 are represented by one of Chemical Formulae 1-1 to 1-4:

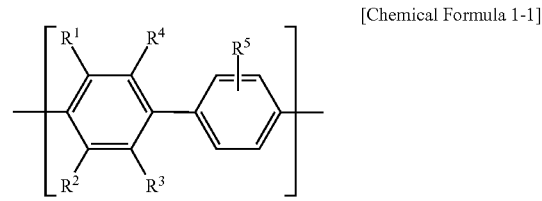

[Chemical Formula 1-1]

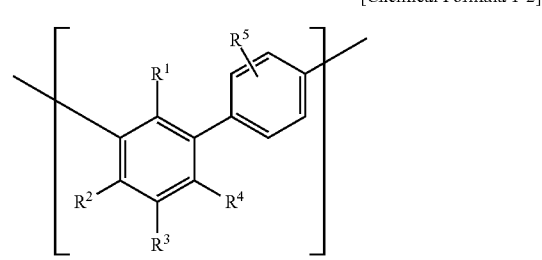

[Chemical Formula 1-2]

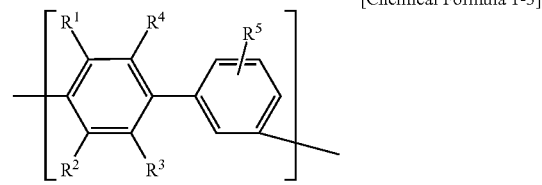

[Chemical Formula 1-3]

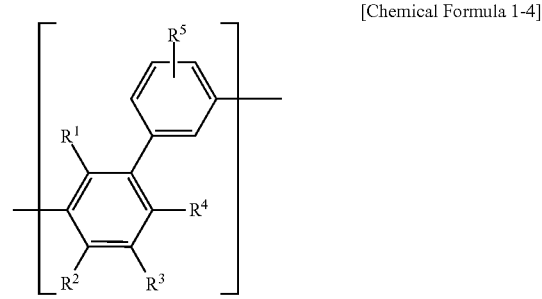

[Chemical Formula 1-4]

wherein, in Chemical Formula 1-1 to Chemical Formula 1-4,
$R^1$ to $R^5$ are each independently hydrogen, deuterium, a halogen, a hydroxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 heteroalkyl group, a substituted or unsubstituted C3 to C30 cycloalkyl group, a substituted or unsubstituted C1 to C30 heterocycloalkyl group, a substituted or unsubstituted C1 to C30 arylalkyl group, a substituted or unsubstituted C6 to C30 heteroarylalkyl group, a substituted or unsubstituted C6 to C30 aryl group, a substituted or unsubstituted C3 to C30 heteroaryl group, or a combination thereof, and
at least one of $R^1$ to $R^5$ is a hydroxy-substituted C6 to C30 aryl group or a hydroxy-substituted C3 to C30 heteroaryl group.

7. The hardmask composition as claimed in claim 6, wherein:
the substituted biphenylene repeating units represented by Chemical Formula 1-1 are represented by Chemical Formula 1-1a, and
the substituted biphenylene repeating units represented by Chemical Formula 1-2 are represented by Chemical Formula 1-2a:

[Chemical Formula 1-1a]

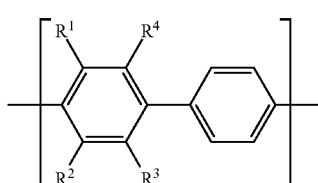

[Chemical Formula 1-2a]

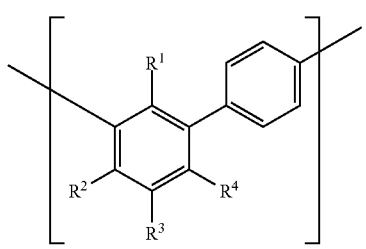

wherein, in Chemical Formula 1-1a and Chemical Formula 1-2a, $R^1$ to $R^4$ are each independently hydrogen, deuterium, a halogen, a hydroxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 hetero alkyl group, a substituted or unsubstituted C3 to C30 cycloalkyl group, a substituted or unsubstituted C1 to C30 heterocycloalkyl group, a substituted or unsubstituted C1 to C30 arylalkyl group, a substituted or unsubstituted C6 to C30 heteroarylalkyl group, a substituted or unsubstituted C6 to C30 aryl group, a substituted or unsubstituted C3 to C30 heteroaryl group, or a combination thereof, and at least one of $R^1$ to $R^4$ is a hydroxy-substituted C6 to C30 aryl group or a hydroxy-substituted C3 to C30 heteroaryl group.

8. The hardmask composition as claimed in claim 6, wherein:

the substituted biphenylene repeating units represented by Chemical Formula 1-3 are represented by Chemical Formula 1-3a, and the substituted biphenylene repeating units represented by Chemical Formula 1-4 are represented by Chemical Formula 1-4a:

[Chemical Formula 1-3a]

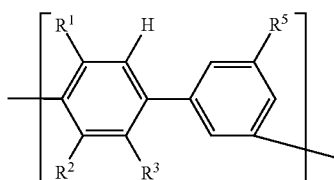

[Chemical Formula 1-4a]

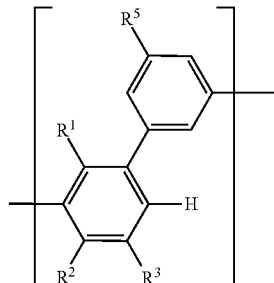

wherein, in Chemical Formula 1-3a and Chemical Formula 1-4a, $R^1$ to $R^3$ and $R^5$ are each independently hydrogen, deuterium, a halogen, a hydroxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 heteroalkyl group, a substituted or unsubstituted C3 to C30 cycloalkyl group, a substituted or unsubstituted C1 to C30 heterocycloalkyl group, a substituted or unsubstituted C1 to C30 arylalkyl group, a substituted or unsubstituted C6 to C30 heteroarylalkyl group, a substituted or unsubstituted C6 to C30 aryl group, a substituted or unsubstituted C3 to C30 heteroaryl group, or a combination thereof, and at least one of $R^1$ to $R^3$ and $R^5$ is a hydroxy-substituted C6 to C30 aryl group or a hydroxy-substituted C3 to C30 heteroaryl group.

9. The hardmask composition as claimed in claim 1, wherein at least one of $R^6$ to $R^8$ is a hydroxy-substituted C6 to C30 aryl group or a hydroxy-substituted C3 to C30 heteroaryl group.

10. The hardmask composition as claimed in claim 9, wherein one or two of $R^6$ to $R^8$ are a hydroxy-substituted C6 to C30 aryl group or a hydroxy-substituted C3 to C30 heteroaryl group.

11. The hardmask composition as claimed in claim 1, wherein the substituted biphenylene repeating units represented by Chemical Formula 2 are represented by Chemical Formula 2-1:

[Chemical Formula 2-1]

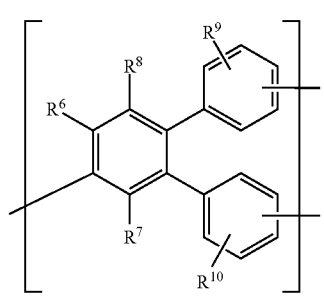

wherein, in Chemical Formula 2-1, $R^6$ to $R^{10}$ are each independently hydrogen, deuterium, a halogen, a hydroxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 hetero alkyl group, a substituted or unsubstituted C3 to C30 cycloalkyl group, a substituted or unsubstituted C1 to C30 heterocycloalkyl group, a substituted or unsubstituted C1 to C30 arylalkyl group, a substituted or unsubstituted C6 to C30 heteroarylalkyl group, a substituted or unsubstituted C6 to C30 aryl group, a substituted or unsubstituted C3 to C30 heteroaryl group, or a combination thereof, and at least one of $R^6$ to $R^{10}$ is a hydroxy-substituted C6 to C30 aryl group or a hydroxy-substituted C3 to C30 heteroaryl group.

12. The hardmask composition as claimed in claim 11, wherein the substituted biphenylene repeating units represented by Chemical Formula 2-1 are represented by Chemical Formula 2-1a:

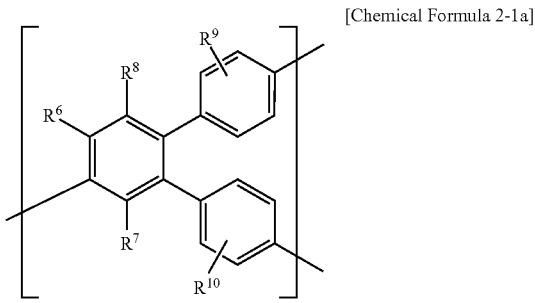

[Chemical Formula 2-1a]

wherein, in Chemical Formula 2-1a, $R^6$ to $R^{10}$ are each independently hydrogen, deuterium, a halogen, a hydroxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 hetero alkyl group, a substituted or unsubstituted C3 to C30 cycloalkyl group, a substituted or unsubstituted C1 to C30 heterocycloalkyl group, a substituted or unsubstituted C1 to C30 arylalkyl group, a substituted or unsubstituted C6 to C30 heteroarylalkyl group, a substituted or unsubstituted C6 to C30 aryl group, a substituted or unsubstituted C3 to C30 heteroaryl group, or a combination thereof, and at least one of $R^6$ to $R^{10}$ is a hydroxy-substituted C6 to C30 aryl group or a hydroxy-substituted C3 to C30 heteroaryl group.

13. The hardmask composition as claimed in claim 1, wherein the plurality of substituted biphenylene structural units in the polymer are the same.

14. The hardmask composition as claimed in claim 1, wherein the polymer includes 4 to 100 of the substituted biphenylene structural units along the backbone thereof.

15. The hardmask composition as claimed in claim 1, wherein the polymer has a weight average molecular weight of 2,000 to 100,000.

16. A hardmask layer comprising a cured product of the hardmask composition as claimed in claim 1.

17. The hardmask layer as claimed in claim 16, wherein the cured product includes a condensed polycyclic aromatic hydrocarbon.

18. A method of forming patterns, the method comprising:
applying the hardmask composition as claimed in claim 1 on a material layer and heat treating the same to form a hardmask layer,
forming a photoresist layer on the hardmask layer,
exposing and developing the photoresist layer to form a photoresist pattern,
selectively removing the hardmask layer using the photoresist pattern to expose a part of the material layer, and
etching an exposed part of the material layer.

* * * * *